(12) United States Patent
Yamazaki

(10) Patent No.: US 6,294,441 B1
(45) Date of Patent: Sep. 25, 2001

(54) METHOD OF MANUFACTURING A SEMICONDUCTOR DEVICE

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/375,348

(22) Filed: Aug. 17, 1999

(30) Foreign Application Priority Data

Aug. 18, 1998 (JP) .................................................. 10-232080

(51) Int. Cl.⁷ ............................. H01L 21/20; H01L 21/36
(52) U.S. Cl. ......................... 438/486; 438/166; 438/487
(58) Field of Search ................................. 136/258; 117/8; 438/166, 486, 487

(56) References Cited

U.S. PATENT DOCUMENTS

| | | | |
|---|---|---|---|
| 5,700,333 | 12/1997 | Yamazaki et al. | 136/258 |
| 5,843,225 | 12/1998 | Takayama et al. | 117/8 |
| 5,897,347 | 4/1999 | Yamazaki et al. | 438/166 |
| 5,915,174 | 6/1999 | Yamazaki et al. | 438/166 |
| 6,066,518 | * 5/2000 | Yamazaki | 438/166 |
| 6,077,731 | * 6/2000 | Yamazaki et al. | 438/150 |
| 6,140,165 | 10/2000 | Zhang et al. | |
| 6,156,628 | 12/2000 | Ohnuma et al. | |

FOREIGN PATENT DOCUMENTS

| | | |
|---|---|---|
| 6-232059 | 8/1994 | (JP) . |
| 6-244103 | 9/1994 | (JP) . |
| 6-244104 | 9/1994 | (JP) . |
| 7-321339 | 12/1995 | (JP) . |

* cited by examiner

*Primary Examiner*—Richard Elms
*Assistant Examiner*—Christian D. Wilson
(74) *Attorney, Agent, or Firm*—Eric J. Robinson; Nixon Peabody LLP

(57) ABSTRACT

To efficiently remove catalytic elements from a crystalline semiconductor film. An Ni film is formed so as to come in contact with a semiconductor thin film of low crystallinity made of an amorphous silicon film, a microcrystalline silicon film or the like. The semiconductor thin film 12 of low crystallinity is heated at 450 to 650° C. to form a crystalline semiconductor thin film in which Ni is diffused. The film is again heated at 500 to 1,100° C. to crystallize amorphous components remained in the semiconductor film to form a crystalline semiconductor film of enhanced crystallinity. Next, the crystalline semiconductor film is irradiated with a laser light or an intense light to have easily diffused Ni that is locally present in the semiconductor film in a form of silicide. Catalytic elements are then selectively added in the crystalline semiconductor film to form XV-element added regions. Subsequently, heating at 500 to 850° C., the catalytic elements remained in a region to be gettered are absorbed in the XV-element added regions.

58 Claims, 14 Drawing Sheets

N - CHANNEL TFT

P - CHANNEL TFT

N - CHANNEL TFT
A - A' SECTION

P - CHANNEL TFT
B - B' SECTION

N - CHANNEL TFT     P - CHANNEL TFT

METHOD OF MANUFACTURING A SEMICONDUCTOR DEVICE

BACKGROUND OF THE INVENTION

1. Field of the Invention

The present invention relates to a method of manufacturing a semiconductor device with the use of a crystalline semiconductor thin film. The category of a semiconductor device according to the present invention includes not only devices such as a thin film transistor and a MOS transistor but also an electronic equipment that has a semiconductor circuit consisted of these insulated-gate type semiconductor devices and an electronic equipment such as a personal computer or a digital camera which is provided with an electro-optical display device comprising an active matrix substrate (typically, a liquid crystal display device).

2. Description of the Related Art

A thin film transistor (TFT) is known at present as a semiconductor device using a semiconductor film. The TFT is utilized in various kinds of integrated circuits, especially for a switching device of a matrix circuit in an active matrix type liquid crystal display device. Further, accompanying recent progress in increasing mobility of the TFT, it has become popular to utilize the TFT as a device of a driver circuit for driving the matrix circuit. In order to utilize the TFT for the driver circuit, a semiconductor layer is necessarily a crystalline silicon film in which the mobility is higher than in the amorphous silicon film. This crystalline silicon film is called polycrystalline silicon, polysilicon, microcrystalline silicon, or the like.

A conventionally known method of forming a polycrystalline silicon film includes a method in which a polycrystalline silicon film is directly formed, and a method in which an amorphous silicon film is formed by a CVD method and is subjected to heat treatment at 600 to 1100° C. for 20 to 48 hours to crystallize the amorphous silicon. A polycrystalline silicon film formed by the latter method has larger crystal grains and gives more excellent characteristics to a semiconductor device manufactured from the film.

When a crystalline silicon film is formed on a glass substrate through the latter method, the upper limitation of about 600° C. is put on the process temperature for crystallization, thereby taking a lot of time in crystallizing step. The temperature of 600° C. is close to the lowest temperature for crystallizing silicon, and the temperature equal to or less than 500° C. cannot afford to crystallize silicon in a sufficiently short time period that is paying in terms of industrial production.

To shorten the crystallization period, the use of a quartz substrate having high distortion point and rising a crystallizing temperature to about 1,000° C. are appropriate. However, a quartz substrate is very expensive as compared to a glass substrate, making it difficult to increase the area of the substrate. For instance, Corning 7059 glass that is widely used in active type liquid crystal display device has a glass distortion point of 593° C., and hence the glass substrate suffers shrinkage and deformation when heated at 600° C. or more for several hours. The crystallizing process is therefore required to be lowered in temperature and shortened in time period so that a glass substrate such as Corning 7059 glass can be utilized.

The technique of crystallizing with excimer laser is one of the techniques which enable the process to be lowered in temperature and shortened in time period. An excimer laser light can give, barely putting a substrate under a thermal effect, the semiconductor film an energy comparable to the energy by a thermal annealing of around 1,000° C. in a short period, and can form a semiconductor film of high crystallinity. However, the excimer laser has nonuniform energy distribution on the irradiated surface, with the result that the crystallinity of the obtained crystalline semiconductor film is varied and device characteristics are also varied between TFTs.

Then, the present inventors have disclosed a technique with which the crystallizing temperature is lowered while using a heat treatment in Japanese Patent Application Laid-Open Nos. Hei 6-232059, Hei 7-321339 and others. In the technique of the publications above, a minute quantity of catalytic elements are introduced into an amorphous silicon film to which a heat treatment is subsequently applied to obtain a crystallized silicon film. Used as the elements for promoting the crystallization are elements selected from Ni, Fe, Co, Ru, Rh, Pd, Os, Ir, Pt, Cu, Au and Ge, which are invasive elements with respect to silicon.

At the crystallization in the publications above, a heat treatment causes the catalytic elements to be diffused in the amorphous silicon film to advance crystallization of the amorphous silicon film. The employment of the crystallizing technique in the publications above thus makes it possible to form crystalline silicon with a heat treatment of 450 to 600° C. for 4 to 12 hours, which allows the use of a glass substrate.

The crystallization in the publications above, however, has a problem that the catalytic elements are remained in the crystalline silicon film. Remaining catalytic elements impair semiconductor characteristics of the silicon film and damage the stability and the reliability of a device fabricated from the film.

To eliminate this problem, the present applicant has investigated methods of removing (gettering) the catalytic elements from a crystalline silicon film. One of those methods (referred to as the first method) is a heat treatment in an atmosphere containing a halogen element such as chlorine. In this method, the catalytic elements in the film are gasified as halogenate.

Another method (referred to as the second method) among those is a heat treatment subsequent to selective addition of phosphorus into the crystalline silicon film. With the heat treatment, the catalytic elements are diffused into a phosphorus added region and are captured in this region.

However, the first method requires to set the heat treatment temperature to 800° C. or more so that the gettering effect is obtained, and cannot use a glass substrate. On the other hand, the second method has a drawback that the treatment takes ten and several hours, though the heat temperature may be set to 600° C. or less.

SUMMARY OF THE INVENTION

The present invention has been made in view of the above, and therefore an object of the present invention is to provide a method of efficiently conducting a removing step of catalytic elements when using the technique of removing the catalytic elements in the second method described above.

Another object of the present invention is to make it possible to form on a glass substrate a semiconductor device of high performance with a process temperature of 600° C. or less.

Removing the catalytic elements takes time for the possible reason that, upon completion of crystallization, most catalytic elements in the crystalline silicon film are present in a bonded state with silicon, not in their atomistic form. To remove the catalytic elements from the crystalline silicon film, this bond is necessarily cut. When nickel is used as the catalytic elements for instance, they are considered to be present as nickel silicide.

For the purpose of confirming this, a silicon film crystallized by the use of nickel is etched for about 30 seconds with FPM (an etchant prepared by mixing 50% HF and 50% $H_2O_2$ at a ratio of 1 to 1). The FPM is capable of removing nickel silicide in a short period of time, and the presence of the nickel silicide can be confirmed by observing whether or not a hole is formed by etching.

On the crystallized silicon film, holes are found to be irregularly formed by the FPM treatment. Though will be explained later, this means that nickel is locally present in the crystallized region and is bonded with silicon to form silicide in this nickel-localized portion.

Then, the present invention adopts as the principal construction a process in which bond between catalytic elements and semiconductor is cut by irradiating a crystallized semiconductor film with a laser light or infrared light to diffuse the catalytic elements in their atomistic form. This construction makes the catalytic elements easy to diffuse in a semiconductor film, for which the removing step of the catalytic elements is expected to be lowered in temperature and shortened in time.

The present invention developed to attain the above-described object is characterized by having as its main construction a process comprising:

an introducing step of introducing catalytic elements into a semiconductor film of low crystallinity;

a first heat treatment step of applying heat treatment to the semiconductor film of low crystallinity;

a second heat treatment step of applying heat treatment to the semiconductor film that has been subjected to the first heat treatment;

a catalyst-removing (gettering) step of applying heat treatment to the semiconductor film that has passed through the second heat treatment to remove the catalytic elements in the film; and a light annealing step of irradiating with a laser light or an intense light the semiconductor film that has passed through the second heat treatment, the step being put somewhere between the second heat treatment step and the catalyst-removing step.

In the introducing step above, the semiconductor film of low crystallinity is either a noncrystalline semiconductor film that does not assume crystallinity or a semiconductor thin film having crystallinity but almost no crystal grain of 100 nm order or higher. To be concrete, the semiconductor film of low crystallinity refers to an amorphous semiconductor film and a microcrystalline semiconductor film. The microcrystalline semiconductor film is a semiconductor film in which an amorphous forms a mixed phase together with a microcrystal containing crystal grains as large as several to several tens nm.

More specifically, the semiconductor film of low crystallinity includes an amorphous silicon film, a microcrystalline silicon film, an amorphous germanium film, a microcrystalline germanium film and an amorphous $Si_1Ge_{1-x}$ (0<x<1), and those semiconductor films are formed through a chemical vapor phase method such as a plasma CVD method or a reduced pressure CVD method.

The catalytic elements are elements that have a function of promoting crystallization of semiconductor, in particular, silicon, and usable element are one or plural kinds of elements selected from Ni, Fe, Co, Ru, Rh, Pd, Os, Ir, Pt, Cu, Au and Ge which are metal elements invasive with respect to silicon.

The catalytic elements above may be introduced by adding the catalytic elements into the semiconductor film of low crystallinity, or by forming a film containing the catalytic elements so as to come in contact with the upper or lower surface of the semiconductor film of low crystallinity.

In the former method, a semiconductor film of low crystallinity is formed and then the catalytic elements are added into the semiconductor film of low crystallinity through an ion implantation method, a plasma doping method or the like.

In the latter method, the film containing the catalytic elements may be formed through, for example, deposition utilizing a CVD method, a sputtering method, etc., or through coating with a solution containing the catalytic elements by the use of a spinner. Formation of the film containing the catalytic elements may be performed either before or after formation of the semiconductor film of low crystallinity. If the semiconductor film of low crystallinity is formed first, the film containing the catalytic elements is formed in close contact with the upper surface of the semiconductor film and, when that formation order is reversed, the film containing the catalytic elements is formed in close contact with the lower surface of the semiconductor film. In the present invention, the term "be in close contact" refers to, not restricted to a case where the semiconductor film is literally in close contact with the catalytic-element film, a case where an oxide film or a natural oxide film with a thickness of about 10 nm is sandwiched between those films as long as the catalytic elements can be diffused in the semiconductor film.

When Ni is used as a catalytic element in the introducing step, for instance, it is appropriate to form an Ni film or an Ni silicide film through the deposition.

Alternatively, when the coating is employed, a usable solution may be a solution having a solute of nickel salt such as nickel bromide, nickel acetate, nickel oxalate, nickel carbonate, nickel chloride, nickel iodide, nickel nitrate and nickel sulfate, and a solvent consisted of water, alcohol, acid and ammonia, or may be a solution having a solute of the nickel element and a solvent selected from a group consisting of benzene, toluene, xylene, carbon tetrachloride, chloroform and ether. Nickel does not need to be dissolved completely, an emulsion-like material in which nickel is dispersed through a medium may also be used.

Alternatively, a method may be employed in which nickel as a simple substance or a nickel compound is dispersed in a solution for forming an oxide film to form an oxide film containing nickel. The OCD (Ohka Diffusion Source) that is a product of Tokyo Ohka Kogyo, Inc., may be used as such a solution. With the employment of this OCD solution, a silicon oxide film is readily formed by coating with the solution a surface where the film is to be formed and then by baking it at about 200° C. The same may be applied to the case where other catalytic elements are used.

In respect of how to introduce the catalytic elements, coating has advantages, over the doping or the film formation of Ni by a sputtering method. The coating is easiest in adjustment of concentration of the catalytic elements in the semiconductor film of low crystallinity, and simplifies the process.

The first heat treatment step mentioned above is a step provided for diffusing the catalytic elements in the semiconductor film of low crystallinity. When the heat treatment is applied to the semiconductor film of low crystallinity to which the catalytic elements have been introduced, the catalytic elements immediately invade the inside of the semiconductor film to be diffused. The catalytic elements then exert, while being diffused, catalytic action on molecular chains in an amorphous state to crystallize the semiconductor film of low crystallinity.

This catalytic action is disclosed by the present applicant in Japanese Patent Application Laid-Open Nos. Hei 06-244103, Hei 06-244104 and others. Since the catalytic element is of an invasive atom with respect to silicon, silicon that is in contact with the catalytic element is bonded to the catalytic element to form silicide. It has been found that silicide then reacts with the silicon bond in an amorphous state to progress the crystallization. This is because the distance between the atoms of the catalytic element and of silicon has a very close value to that of the distance between atoms in single crystal silicon. The distance between Ni—Si has the closest value to that of the distance between single crystal Si—Si, and is shorter by about 0.6% of the latter.

When schematizing the reaction for crystallizing an amorphous silicon film with the use of nickel as a catalytic element, it will be expressed by the following reaction formula:

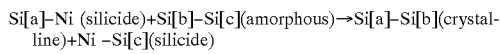

Si[a]–Ni (silicide)+Si[b]–Si[c](amorphous)→Si[a]–Si[b](crystalline)+Ni –Si[c](silicide)

In the reaction formula above, the indicators [a], [b] and [c] indicate positions of Si atoms.

The reaction formula shows that distance between Si[a] and Si[b] is almost equal to the distance in a single crystal because an Ni atom in silicide is substituted by an Si[b] atom of silicon in an amorphous portion. It also shows that Ni causes crystals to grow while being diffused in the semiconductor film of low crystallinity. Further shown by the formula is that, upon completion of the crystallizing reaction, Ni is locally present at the termination of the diffusion (or at the front of the crystal growth) in a bonded state with Si. In other words, Ni in a form of silicide expressed as $NiSi_x$ is irregularly distributed in the film after crystallization. The presence of this silicide may be confirmed as holes by applying the FPM treatment to the film after crystallization, as mentioned above.

Incidentally, it has been found that the energy for promoting this crystallization reaction is appropriately given through heating in a heating furnace at a temperature of 450° C. or more. The upper limitation of the heating temperature is set to 650° C. This is set in consideration for preventing crystallization of the amorphous semiconductor film from being progressed at a portion where the film does not react with the catalytic elements. If the film is crystallized at the portion where it does not react with the catalytic elements, the catalytic elements cannot be diffused in that portion, so that crystal grains cannot be increased in size and variation takes place in the grain size thereof.

The second heat treatment above has an object of enhancing and improving the crystallinity of the crystalline semiconductor film that has been crystallized by the catalytic elements.

The crystalline semiconductor film formed by the first heat treatment has defects in crystal grains and an amorphous portion remained. Therefore in the present invention, a heat treatment is again performed to crystallize the amorphous portion and to eliminate the defects in crystal grains. This time, the heat temperature is set higher than in the first heat treatment, specifically to 500 to 1,100° C., and preferably 600 to 1,100° C. It is needless to say that, upon practicing the process, the upper limitation of the temperature is determined depending on the heat resistance temperature of a substrate.

At this step, an excimer laser light may be irradiated instead of the heat treatment. However, the excimer laser has inevitable variation in irradiation energy as mentioned above, involving a fear that the crystallization of the amorphous portion varies. Particularly, under this state where every film has different distribution of the amorphous portion, there is a fear that variations take place not only in characteristics between devices in one semiconductor device but also in characteristics between semiconductor devices.

For that reason, it is desirable to apply without fail a heat treatment after the crystallizing step and before irradiation with an excimer laser light so that the amorphous portion is crystallized and the defects are reduced. Accordingly, it is important to use a heat treatment to improve the crystallinity when excimer laser is used at the subsequent light annealing step.

Known as a heating method equivalent to the heat treatment in a heating furnace is the RTA method in which infrared light that peaks at the wavelength of 0.6 to 4 μm, preferably 0.8 to 1.4 μm is irradiated for several tens to several hundreds seconds. A semiconductor film that has high absorption coefficient with respect to infrared light is heated up to 800 to 1,100° C. in a short period of time by irradiation with infrared light. However, in the RTA method, irradiation takes longer time than irradiation with excimer laser so that a substrate readily absorbs the heat, and hence attention should be given to occurrence of deflection when using a glass substrate.

One of the objects of the present invention is to remove (getter) the catalytic elements that are locally present in the crystallized semiconductor film. In the present invention, a group XV element is used for gettering of the catalytic elements. Here, the group XV element includes P, As, N, Sb and Bi. The element having the highest gettering ability is P and the second highest is Sb.

Enumerated as a removing method of the catalytic elements according to the present invention are a method in which a group XV element is selectively added in the crystalline semiconductor film to form a region (film) containing the group XV element, and a heat treatment is applied thereto to have the catalytic elements absorbed in the region containing the group XV element, and a method in which a film containing a group XV element is formed so as to come in contact with the crystalline semiconductor film and is subjected to a heat treatment so that the semiconductor film contains the group XV element.

In the former method, the region containing a group XV element may be formed in the crystalline semiconductor film through as in introduction of the catalytic elements to the semiconductor film of low crystallinity, a vapor phase method such as a plasma doping method and an ion implantation method.

In the latter method, the film containing a group XV element may be a silicon film or a silicon oxide film that is made to contain a group XV element, which is formed through deposition utilizing a CVD method or a sputtering method, or through coating. A microcrystalline silicon film containing P for forming NI junction, a PSG film and the like typically exemplify the film.

The concentration of a group XV element in the region added with a Group XV element or in the film containing a group XV element is ten times the concentration of the catalytic elements remained in the semiconductor film. In the crystallizing method of the present invention, the catalytic elements are remained in $10^{18}$ to $10^{20}$ atoms/cm$^3$ order, and the concentration of a group XV element is therefore set to $1\times10^{19}$ to $1\times10^{21}$ atoms/cm$^3$.

A heat treatment is conducted to remove (to have gettered) the catalytic elements. With the heat treatment, the catalytic elements are diffused in the region added with a group XV element or in the film containing a group XV element, and are bonded there with the group XV element to be inactivated. Thus, this catalyst-removing step may be regarded as a step of having the catalytic elements absorbed (gettered) in the region added with a group XV element or into the film containing a group XV element.

It has been proved that, when a croup XIII element is added as well as a group XV element, the region or film in which the catalytic elements are absorbed can obtain higher removing effect than in the case where merely a group XV element is added. When the group XIII element is additionally used, the concentration of a group XIII element is 1.3 to 2 times as high as the concentration of a group XV element. The group XIII element includes B, Al, Ga, In and Ti.

Through the catalyst-removing step of the present invention, it is possible to obtain a crystalline semiconductor region where the concentration of the catalytic elements is reduced down to $5\times10^{17}$ atoms/cm$^3$ or less (preferably, $2\times10^{17}$ atoms/cm$^3$ or less).

Under the present circumstance in which the lower limit of detection by the SIMS (secondary ion mass spectroscopy) is about $2\times10^{17}$ atoms/cm$^3$, a concentration lower than that cannot be measured. However, it is assumed that the catalytic elements may be reduced at least to $1\times10^{14}$ to $1\times10^{15}$ atoms/cm$^3$ by performing the removing step shown in this specification.

In the present invention, in order to lower the temperature and shorten the time in the catalyst-removing step, the crystalline semiconductor film is irradiated with a laser light or an intense light prior to this heat treatment. By this irradiation with light (light annealing), the film shifts to a state where the catalytic elements that are locally present in the crystalline semiconductor film are easily diffused.

As described above, the catalytic elements that are distributed in the semiconductor film in a bonded state with semiconductor molecules, for example, in a form of NiSi$_x$, are returned to its atomistic state when the Ni—Si bond is cut by light annealing energy, or enter into a state where remained catalytic elements is easy to diffuse in the crystalline semiconductor film when Ni—Si bond energy is reduced by light annealing energy.

The light annealing of the present invention may decrease energy required to diffuse the catalytic elements, so that the catalytic elements are diffused by heating at 500° C. or more and also the treatment time is shortened. Further, an effect may be expected in reduction of an area of the region or film in which the catalytic elements are absorbed, leading to enlargement of a portion where a device may be formed. The upper limitation of the heating temperature in the catalyst-removing step is about 850° C., a temperature at which the group XV element in the region or film in which the catalytic elements are absorbed does not move.

In the light annealing step, it is appropriate that the semiconductor film is irradiated with light confining to a portion to be a semiconductor layer that constitutes a semiconductor device. The portion should include at least a region where a depletion layer of this semiconductor layer is formed (a channel formation region).

For a light source used in the light annealing, excimer laser having a wavelength of 400 nm or less may be employed. A usable excimer laser may be, for example, KrF excimer laser (248 nm in wavelength), XeCl excimer laser (308 nm in wavelength), XeF excimer laser (351 nm, 353 nm in wavelength), and ArF excimer laser (193 nm in wavelength). Also, XeF excimer laser (483 nm in wavelength) can be used. An ultraviolet lamp may be used. Alternatively, an infrared lamp such as a xenon lamp and an arc lamp may be used. Also may be used an excimer laser light of pulse oscillation type.

DESCRIPTION OF THE PREFERRED EMBODIMENTS

Description will be made of Embodiments of the present invention with reference to FIGS. 1A to 3D.

Embodiment 1

This embodiment will be described with reference to FIGS. 1A to 1G.

Figure 1A:
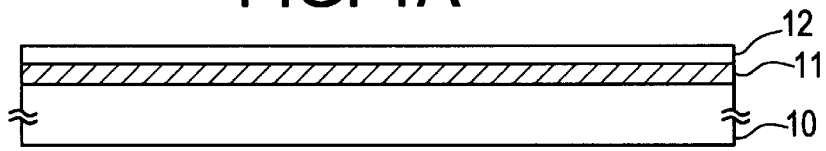
FIGS. 1A to 1G are views showing a manufacturing process according to Embodiment 1.

As shown in FIG. 1A, a substrate 10 is prepared and an under film 11 is formed on the surface thereof. A substrate that may be used as the substrate 10 includes: insulating substrates such as a glass substrate, a quartz substrate and a ceramic substrate; a single crystal silicon substrate; and further, conductive substrates such as a stainless substrate, a Cu substrate and a substrate made of a metal material having high melting point, e.g., Ta, W, Mo, Ti, Cr, or made of an alloy of those bases (for example, a nitrogen based alloy).

The base film 11 has a function of preventing impurities from being diffused into a semiconductor device from the substrate and another function of enhancing coherence between the substrate and a semiconductor film or a metal film, which is formed on the substrate 10, to prevent one from being peeled off the other. Used as the base film 11 may be an inorganic insulating film such as a silicon oxide film, a silicon nitride film and a silicon nitride oxide film which are formed through a CVD method. In the case that a silicon substrate is used for example, the base film may be formed by oxidizing the surface of the substrate through thermal oxidation. When a heat-resistant substrate such as a quartz substrate or a stainless substrate is used, the base film may be formed by forming and thermally oxidizing an amorphous silicon film.

Further, the base film 11 may be a coat made of a metal having high melting point such as tungsten, chromium or tantalum or may be a laminated film comprising the lower layer of a coat, such as a aluminum nitride film, which has high conductivity and the upper layer of the inorganic insulating film mentioned above. In the latter case, heat generated in the semiconductor device is radiated from the coat of the lower layer of the base film 11 so that the action of the semiconductor device may be stabilized.

On the base film 11, a semiconductor thin film 12 of low crystallinity is formed through a vapor phase method such as plasma CVD, a reduced pressure CVD method or thermal CVD. A reduced pressure CVD method is chosen here to form an amorphous silicon film with a thickness of 10 to 150 nm. Though a plasma CVD method is superior in productivity to a reduced pressure CVD method, the latter has an advantage over the former that the film formation may take a time but a denser film can be formed (FIG. 1A).

Figure 1B:

Next, a catalytic element will be introduced into the semiconductor film 12 of low crystallinity. Employed here is a method in which a film 13 containing the catalytic element is formed on the surface of the semiconductor film 12 of Low crystallinity. For instance, the surface is coated with an Ni acetate solution in a spinner and is held in this state for several minutes. Dried by a spinner, an Ni film 13 is formed. Practically appropriate concentration of nickel in the solution is 1 ppm or more, preferably 10 ppm or more (FIG. 1B).

Figure 1C:
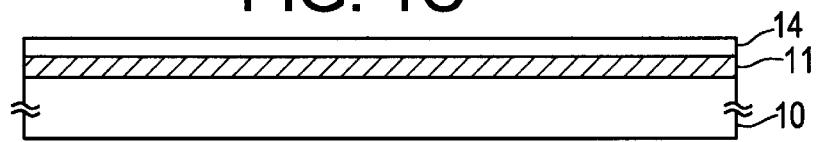

The semiconductor film 12 of low crystallinity having the catalytic element introduced thereto is then subjected to a heat treatment in a heating furnace to form a crystalline semiconductor thin film 14. The heating is conducted in conformity with the heat treatment condition: in nitrogen atmosphere that is inert gas atmosphere of nitrogen or the like, at a temperature of 450 to 650° C., and for 4 to 12 hours. In this Embodiment, the nickel element, that is in contact with the entire surface of the semiconductor film of low crystallinity, is diffused from the surface of the semiconductor film of low crystallinity toward the direction of the base film, i.e., in a direction almost perpendicular to the substrate surface, so that the crystallization is progressed (FIG. 1C).

After forming the semiconductor film 14 having crystallinity is formed through the heat treatment, another heat treatment at 500 to 1100° C. is applied to crystallize amorphous components remained in the semiconductor film 14 and to reduce defects in crystal grains. The crystallinity is thus improved to form a crystalline semiconductor film 15 of enhanced crystallinity.

Figure 1D:
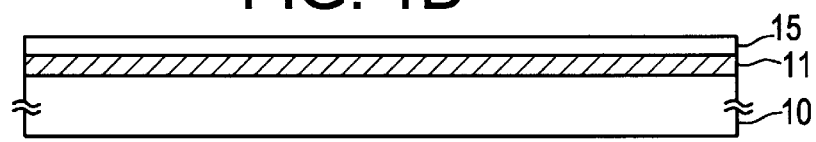

The crystalline semiconductor film 15 is then irradiated with a laser light or an intense light so that nickel locally present in a form of silicide in the semiconductor film 15 is easily diffused (FIG. 1D).

Figure 1E:
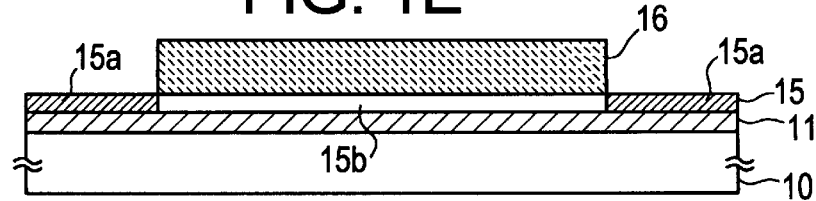

Subsequently, a group XV element will be selectively added in the crystalline semiconductor film 15. A mask insulating film 16 is first formed on the semiconductor film 15. Resist or silicon oxide may be used as the mask insulating film 16. The mask insulating film 16 here is formed by forming and patterning a silicon oxide film with a thickness of 100 nm. Then, the group XV element is selectively added by a plasma doping method or through the coating to form XV-added regions 15a in the semiconductor film 15. Region 15b where the group XV element is not added is called, for convenience's sake, a region to be gettered (FIG. 1E).

The concentration of the group XV element in the regions 15a is ten times the concentration of the catalytic element in the region 15b to be gettered. In the method of this Embodiment, the catalytic element is remained in the region 15b by $10^{19}$ to $10^{20}$ atoms/cm$^3$ order, and hence the concentration of the group XV element in the regions 15a is set to $1\times10^{20}$ to $1\times10^{21}$ atoms/cm$^3$.

Figure 1F:
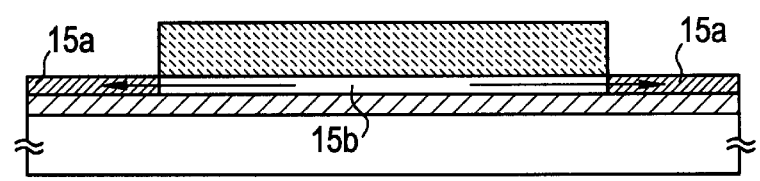
Figure 1G:
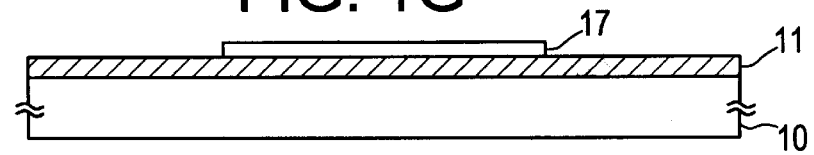

A heat treatment at 500 to 850° C. is applied to diffuse the catalytic element remained in the region 15b to be gettered to the regions 15a added with group XV element, where the catalytic element is absorbed. With this heat treatment, the concentration of the catalytic element (Ni) in the region 15b is reduced to $2\times10^{17}$ atoms/Cm$^3$ or less (FIG. 1F).

After the catalyst-removing step, the region 15b is patterned into a shape of an island to form an island-like semiconductor layer 17. A semiconductor device such as a TFT may be fabricated using the semiconductor layer 17.

In the present invention, the region 15b to be gettered is annealed with light prior to the catalyst-removing step, thereby making it possible to shorten the time required for the removing step, reduce the area of the group XV element regions 15a and enlarge a region where a device may be formed (which corresponds here to the region 15b to be gettered).

Embodiment 2

This Embodiment will be described with reference to FIGS. 2A to 2F. This Embodiment adopts a modification of the introducing method of catalytic element in Embodiment 1, and shows how to form a gate insulating film after the formation of the semiconductor layer. The rest of the process is similar to Embodiment 1.

In this Embodiment, because of inclusion of a thermal oxidizing step, a substrate 20 is prepared by selecting out the above-described substrates a quartz substrate or a substrate made of a metal with high melting point such as tungsten. An base film 21 is formed on the surface of the substrate 20.

Next, an amorphous silicon film is formed as a semiconductor film 22 of low crystallinity through a reduced pressure CVD method. The thickness of the amorphous silicon film is set to 20 to 100 nm (preferably 40 to 75 nm). The film thickness here is set to 65 nm. Incidentally, a plasma CVD method may be used on condition that the film quality equal to the quality of the amorphous silicon film formed through the reduced pressure CVD method is obtained.

Subsequently, a mask insulating film 23 is formed on the semiconductor film 22 of low crystallinity made of the amorphous silicon film. The mask insulating film 23 is provided with an aperture 23a formed by patterning. This aperture 23a defines a region added with catalytic element. Resist or a silicon oxide film may be used for the mask insulating film 23. The film 23 here is formed of a silicon oxide film having a thickness of 120 nm.

Figure 2A:
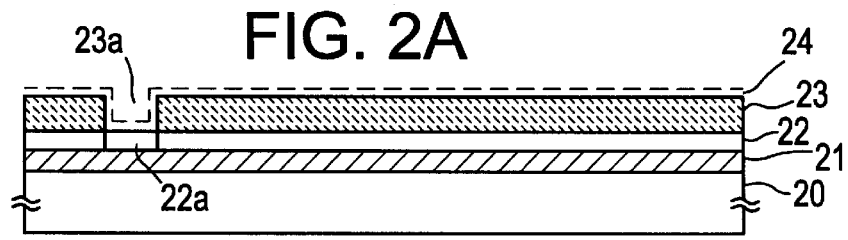
FIGS. 2A to 2F are sectional views showing a manufacturing process according to Embodiment 2.

The film is coated through a spin coating method with a solution in which nickel acetate containing nickel by 5 to 10 ppm in terms of weight is dissolved in ethanol, and is dried to form an Ni film as a film 24 containing a catalytic element on the mask insulating film 23. In this state, nickel in the aperture 23a provided in the mask insulating film 23 is in contact with the semiconductor film 22 of low crystallinity (FIG. 2A).

Figure 2B:
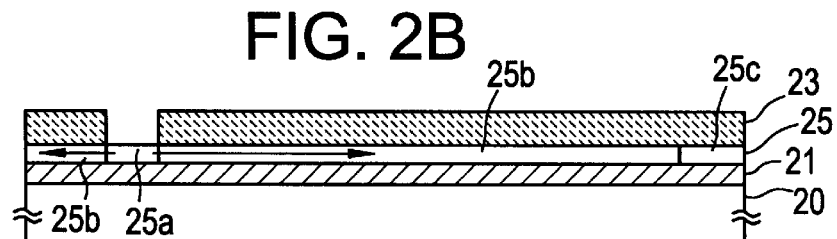

Then, dehydrogenation is conducted in a heating furnace at 450° C. for about 1 hour, and thereafter, in order to diffuse the catalytic element from the film 24 containing the catalytic element to the semiconductor film 22 of low crystallinity, a heat treatment is carried out in a heating furnace under inert gas atmosphere, hydrogen atmosphere or oxygen atmosphere at a temperature of 450 to 650° C. for a heating period of 4 to 24 hours. As schematically indicated by an arrow in the drawing, the heating causes crystallization while the catalytic element is diffused in the semiconductor film 22 of low crystallinity. The heat treatment here is conducted at 570° C. for 8 hours to form a crystalline semiconductor film 25 in which the catalytic element is diffused (FIG. 2B).

In this catalyst-diffusing step, the diffusion is progressed first from nickel silicide reacted in a region 22a added with the catalyst, to form crystal regions 25b (referred to as lateral growth regions) grown substantially in parallel with the substrate surface of the substrate 20. The lateral growth regions 25b in which crystal grains are gathered to be relatively well aligned have an advantage that the overall crystallinity is superior. A region 25a is a region to which the catalytic element is introduced, and is crystallized, but is not suitable to form a device because the catalytic element of high concentration is remained. Also, a not-crystallized region 25c is a region where the catalytic element is not diffused and the crystallization is not progressed. Consequently, only the lateral growth regions 25b are suitable to form a device of high performance.

Figure 2C:
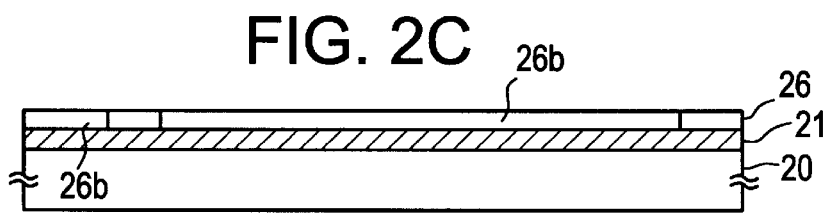

Upon completion of the diffusing step of the catalytic element, the mask insulating film 23 is removed and heat treatment at 500 to 1,100° C. is applied in a heating furnace to form a crystalline semiconductor film 26 of enhanced crystallinity (FIG. 2C).

As a result of a TEM (transmission electron microscopy) observation, crystal grains of the lateral growth regions 26b in the crystalline semiconductor film respectively have a rod shape or a flattened rod shape, and directions of those crystal grains are almost aligned. Nearly all of those crystal grains have substantially {110} orientation, and the directions of <100> axis and the <111> axis of one crystal grain are equal to those of another crystal grain. The <110> axis of one crystal grain is slightly tilted by 2 degrees against adjacent crystal grain. Thus in the lateral growth region 26b, directions of the crystal axes are aligned, so that the atoms in the crystal boundary are smoothly bonded with one another and dangling bonds are decreased to a small number.

On the other hand, in the conventional polycrystalline silicon in which directions of crystal axes are irregular, a large number of atoms that cannot bond are present in the crystal boundary. In point of this, the lateral growth regions 26b of this Embodiment are utterly different in the crystal structure from the conventional polycrystalline silicon film. The lateral growth regions 26b have the crystal grain boundary in which junctions of most atoms are not cut and two crystal grains are joined in a very well aligned manner to form continuous crystal lattices therein, and hence the region has a structure with which the trap level caused by crystal defects or the like is hardly formed.

Next, a laser light or an intense light is irradiated to have easily diffused the catalytic element remained in the lateral growth regions 26b, which is, here, nickel locally present in a bonded state as $NiSi_x$.

As in Embodiment 1, then, a mask insulating film 27 made of a silicon oxide film is then formed so that the lateral growth regions 26b are included in a region 26d to be gettered. Thereafter, P (phosphorus) is added as a group XV element to form regions 26c added with a group XV element. The concentration of the nickel remained in the lateral growth regions 26b is one tenth times of the concentration in Embodiment 1, i.e., $10^{18}$ to $10^{19}$ atoms/cm$^3$. Accordingly, the concentration of phosphorus in the regions 26c is set to $1\times10^{19}$ to $1\times10^{20}$ atoms/cm$^3$.

The group XV element is, passing through the region 26c films, added also in the base film 21 and the substrate 20, resulting that the group XV element of high concentration is contained only in a specific region in the base film 21 or the substrate 20. However, such a group XV element does not affect the TFT characteristics.

Figure 2D:
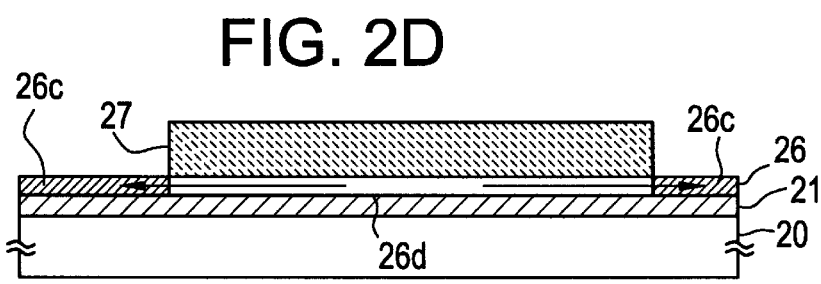
Figure 2E:
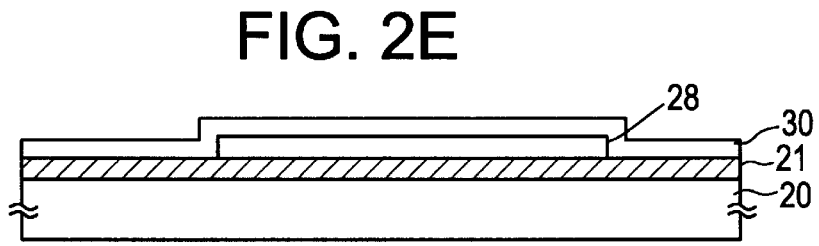

Then, after forming the added regions 26c, a heat treatment is conducted at 500 to 850° C. for 2 to 24 hours to diffuse the catalytic element in the region 26d to be gettered toward the regions 26c added with a group XV element, where the catalytic element is absorbed (diffusion directions are indicated by arrows). Thus may be obtained a lateral growth region in which the catalyst has a decreased concentration of $5\times10^{17}$ atoms/cm$^3$ or less, probably $1\times10^{14}$ to $1\times10^{15}$ atoms/cm$^3$ (FIG. 2D).

Upon completion of the step of removing the catalytic element, the mask insulating film 23 is removed and, then, an island-like semiconductor layer 28 is formed utilizing solely the region 26d to be gettered.

An insulating film 30 made of silicon nitride oxide is next formed by a plasma CVD method or a reduced pressure CVD) method so as to cover the silicon oxide, silicon nitride and the semiconductor layer 28. This insulating film 30 constitutes a gate insulating film, and has a film thickness of 50 to 150 nm.

After forming the insulating film 30, a heat treatment is applied in a heating furnace under oxidizing atmosphere at 800 to 1,100° C. (preferably, 950 to 1,050° C.) to form a thermal oxide film 31 at the interface between the semiconductor layer 28 and the insulating film 30.

The oxidizing atmosphere may appropriately be dry $O_2$ atmosphere, wet $O_2$ atmosphere or atmosphere containing a halogen element (typically, hydrogen chloride). In the case of the atmosphere containing a halogen element, when the insulating film on the semiconductor layer is thin, a gettering effect on nickel by a halogen element may also be expected.

Figure 2F:
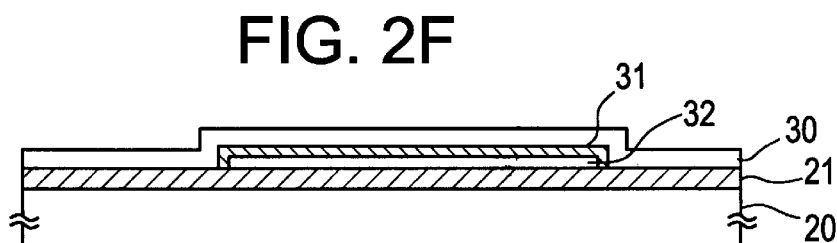

In the thermal oxidizing step, optimal conditions on temperature and time are determined in consideration for the film thickness and the throughput of the objective thermal oxide film. In this description, a heat treatment is performed in a heating furnace under dry oxygen atmosphere at 950° C. for 30 minutes to form a thermal oxide film 31 of 50 nm in thickness. Through this thermal oxidizing step, the semiconductor layer 28 with a thickness of 25 nm is oxidized so that the final film thickness of a semiconductor layer 32 is 40 nm (FIG. 2F).

It is important to put the thermal oxidizing step after the formation of the insulating film 30 as shown above. This is because the formation of the insulating film 30 can prevent, at the thermal oxidizing step, a group XV element that is added in the base film 21 to remove the catalyst from being diffused into the atmosphere and re-added in the semiconductor layer (which is also called auto doping of phosphorus).

Further, the thermal oxidization of the interface between the semiconductor layer 32 and the insulating film 30 results in great reduction in the interface level, so that the interface characteristics are improved by leaps and bounds. The film quality of the insulating film 30 formed through a CVD method is improved and, by thinning the semiconductor layer, reduction in photo leak current may also be expected. Still further, defects in grains of the semiconductor layer are reduced.

It may be considered that all of this owes to surplus silicon atoms that are produced on thermal oxidization of the semiconductor layer 28 made of crystalline silicon, and move toward defects in crystal grains to contribute greatly to formation of the Si—Si bond. This notion is known as the reason for less defects in crystal grains of a high-temperature polysilicon film.

Another assumable model is that a heat treatment at a temperature (typically, 700 to 1,100° C.) exceeding the crystallizing temperature fixedly bonds the semiconductor layer 32 and its base film 21 together, and the enhanced coherence eliminates the defects.

There is a great difference, nearly 10 times, in coefficient of heat expansion between a crystalline semiconductor film and an silicon oxide film that forms the base film. At the stage in which an amorphous silicon film is transformed into a crystalline silicon film, a very large stress is therefore applied to the crystalline silicon film while being cooled, and the coherence between the base film and the crystalline silicon film is small. This is conceivable as a cause of easily produced defects such as stacking fault and dislocation.

Namely, it can be inferred that with crystalline silicon being in a state where it is easily moved, defects such as lamination defects and dislocation are readily produced due to tensile-stress. Such a state remains unchanged through and after the catalyst-removing step.

Then, carrying out the thermal oxidizing step enhances coherence between the base film 21 and the semiconductor layer 32, to thereby suppress occurrence of defects in crystal grains in the semiconductor layer 32.

That is, through the thermal oxidizing step, the semiconductor layer 32 is fixedly bonded to the base film 21 to enhance coherence with substrate and, simultaneously, the surplus silicon atoms compensate defects in crystal grains.

A TFT may be manufactured using the semiconductor layer 32 and using for a gate insulating film the gate insulating film 30 and the thermal oxide film 31, which all are obtained through the steps above.

Embodiment 3

A group XV element is an element that gives N type conductivity to a semiconductor. Thus, in this Embodiment, an N type source/drain region is used as a region where catalytic elements are absorbed.

Figure 3A:
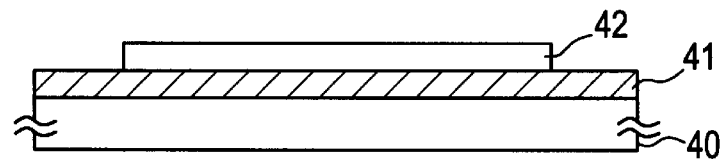
FIGS. 3A to 3D are sectional views showing a manufacturing process according to Embodiment 3.

First, following the steps described in Embodiments 1 and 2, steps up through the irradiating step with a laser light or an intense light are completed and the obtained crystalline semiconductor film is patterned to form a semiconductor layer 42. Reference numeral 40 denotes a substrate and 41 denotes an base film (FIG. 3A).

Incidentally, the irradiation with a laser light or an intense light for having a catalytic element easily diffused may be carried out after forming the semiconductor layer 42. Since this Embodiment intends to reduce the catalytic element in a channel formation region, when to perform the irradiation step does not matter as long as a portion to be the channel formation region is irradiated with a laser light or an intense light.

Next, a gate insulating film 43 and a gate electrode 44 are formed. The gate electrode 44 is formed of a material that may stand the heat treatment temperature in the subsequent catalyst-removing step. An example of the material usable includes silicon added with P, a metal of high melting point such as Ta, W, Mo, Ti and Cr, and an alloy of these (for example, an alloy of one metal of high melting point and another metal of high melting point, an alloy of a metal of high melting point and nitrogen).

Figure 3B:
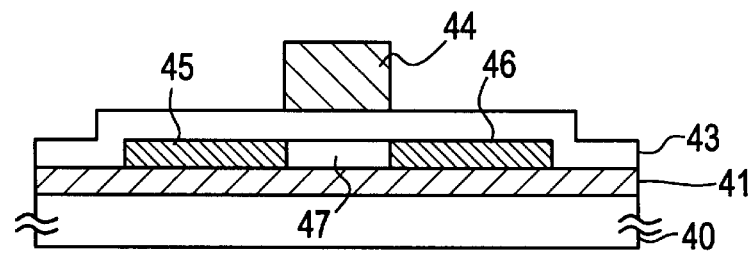
Figure 3C:
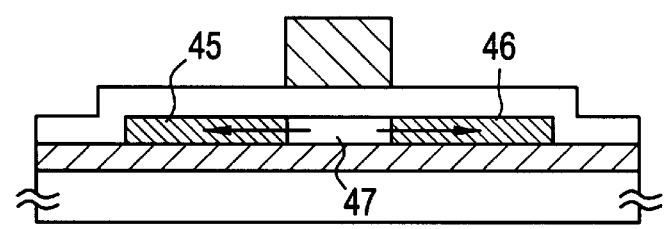
Figure 3D:
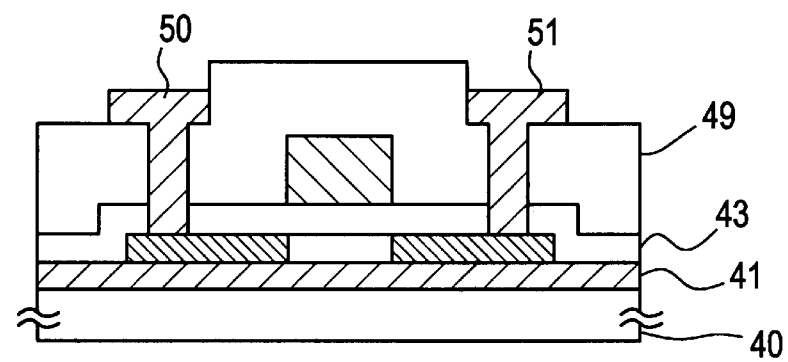

Subsequently, using as a mask the gate electrode 44, a group XV element is added in the semiconductor layer 42 to form in a self-alignment manner an N type source region 45, an N type drain region 46 and a channel formation region 47. Here, P or As is used as the group XV element and added by the concentration of $1 \times 10^{19}$ to $1 \times 10^{21}$ atoms/cm$^3$ (FIG. 3B).

A heat treatment is then applied at 500 to 850° C., preferably 550 to 650° C. for 4 to 8 hours to diffuse the catalytic element in the channel formation region 47 to the source/drain regions 45 and 46. Upon reaching the source/drain regions 45 and 46, the catalytic element is bonded to the group XV element. For instance, when the catalytic element is Ni and the group XV element is P, the catalytic element is present in the source/drain regions 45 and 46 in a bonded state as NiP$_1$, NiP$_2$Ni$_2$ and so on. This bonded state is very stable and hardly influences the action of a TFT.

With this heat treatment, the concentration of the element in the channel formation region 47 may be reduced down to $1 \times 10^{14}$ to $1 \times 10^{15}$ atoms/cm$^3$. It may also be possible to activate the group XV element added in the source/drain regions 45 and 46 to lower the resistance of the source/drain regions 45 and 46.

After completing the catalyst-removing step, an interlayer insulating film 49, a source electrode 50 and a drain electrode 51 are formed in accordance with a known method to finish a TFT.

In Embodiments 1 and 2, the fifteenth-tribe added region needs to be formed, separately from the portion for forming a device, in the semiconductor film. In this Embodiment, however, the source/drain regions 45 and 46 serve as the fifteenth-tribe added region, in other words, the fifteenth-tribe added region is formed at the portion for forming a device, so that the device may be integrated.

EXAMPLES

With reference to FIGS. 4 to 14D, examples of the present invention will be described.

Example 1

This is an example in which the present invention is applied to a TFT, and shows a case where an N channel type TFT and a P channel type TFT are formed on the same substrate to fabricate a CMOS circuit. Reference is made to FIGS. 4 to 6D.

Figure 4:
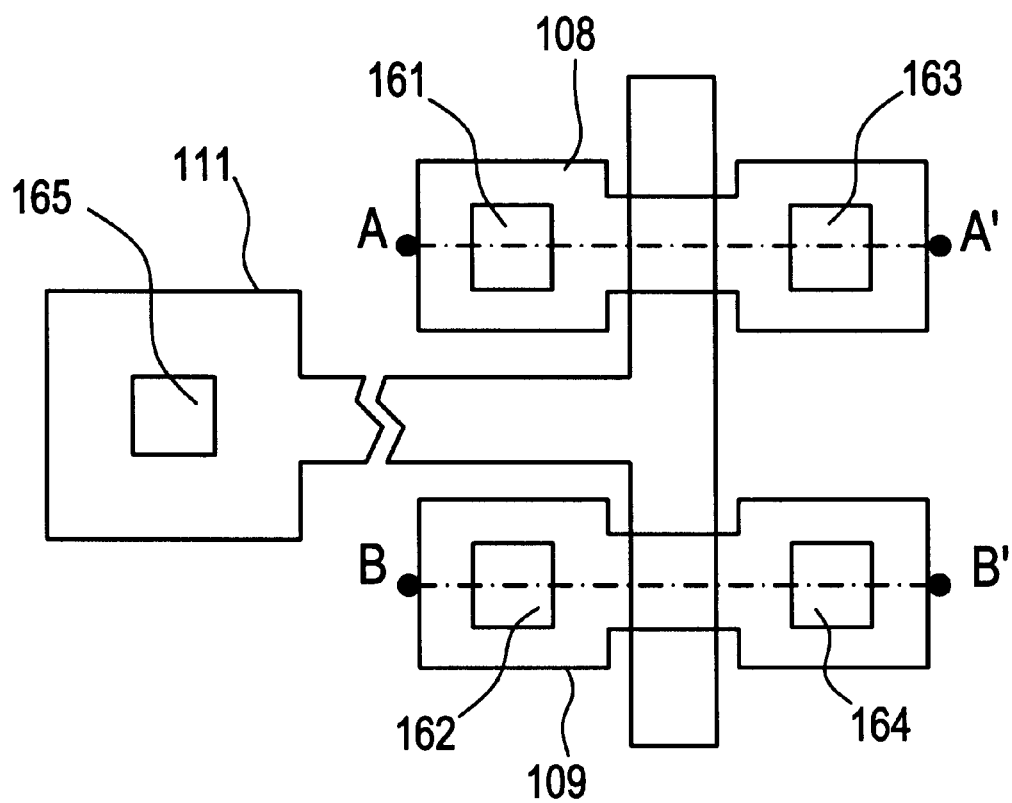
FIG. 4 is a plan view showing a CMOS circuit of Example 1.

FIG. 4 is a top view showing an outline of a CMOS circuit. In FIG. 4, reference numeral 111 denotes a gate wiring; 108, a semiconductor layer of an N channel type TFT; and 109, a semiconductor layer of a P channel type TFT. Denoted by reference numerals 161 and 162 are contact portions between the semiconductor layers 108, 109 and a source wiring; and 163 and 164, contact portions between the semiconductor layers 108, 109 and a drain wiring. Reference numeral 165 denotes a contact portion (a gate contact portion) between the gate wiring 111 and an extraction wiring.

A manufacturing process of a TFT will be described with reference to FIGS. 5A to 6D. In FIGS. 5A to 6D, shown to the left is a sectional view of the N channel type TFT, and to the right is a sectional view of the P channel type TFT. The sectional views of the respective TFTs correspond to sectional views taken along the chain lines A—A' and B—B' in FIG. 4.

First, Corning 1737 glass substrate is used as a glass substrate 100. A silicon oxide film with a thickness of 300 nm is formed as an base film on the glass substrate 100.

A substrate having an insulating surface is thus prepared and, thereafter, an amorphous silicon film 102 is formed as a semiconductor film of low crystallinity through a reduced pressure CVD method using disilane as material gas. The film thickness of the amorphous silicon film 102 is set to 55 nm. Next, a mask insulating film 103 made of a silicon oxide film with a thickness of 120 nm is formed on the amorphous silicon film 102. The mask insulating film 103 is provided with apertures 103a and 103b formed by patterning.

The film is next coated by a spin coater with a solution in which nickel acetate containing nickel by 10 ppm in terms of weight is dissolved in ethanol, and is dried to form an Ni film 104. The Ni film 104 is in contact with the amorphous silicon film 102 in the apertures 103a and 103b provided in the mask insulating film 103. On the amorphous silicon film 102 that is not easy to permeate, an oxide film of about several nm in thickness may be formed by UV irradiation, etc., prior to formation of the mask insulating film 103. With this, it becomes easy to form the Ni film 104 so as to come in contact with the film 102 in the apertures 103a and 103b (FIG. 5A).

Figure 5A:
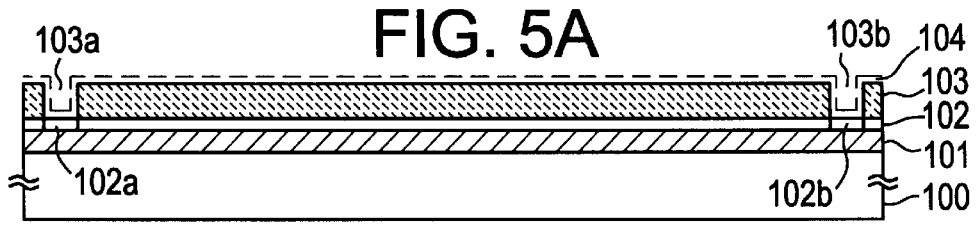
FIGS. 5A to 5F are sectional views showing a manufacturing process of TFTs.
Figure 5B:
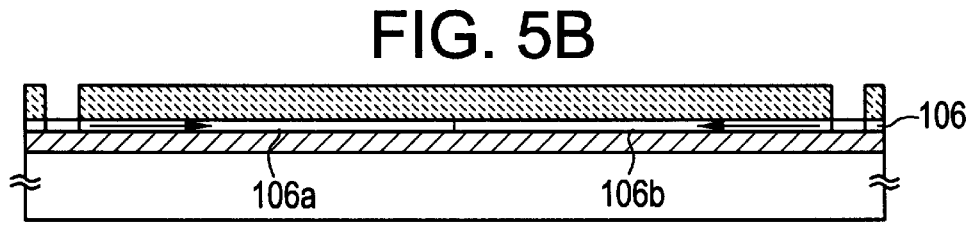

After the state of FIG. 5A is thus obtained, a heat treatment is performed in a heating furnace at 450° C. for about 1 hour to dehydrogenate the amorphous silicon film 102. Thereafter, another heat treatment is applied in a heating furnace under nitrogen atmosphere at 550° C. for 8 hours. Ni is diffused from the Ni film 104 into the amorphous silicon film 102 to advance the crystallization, thereby forming a crystalline silicon film 106 including lateral growth regions 106a and 106b (FIG. 5B).

Figure 5C:
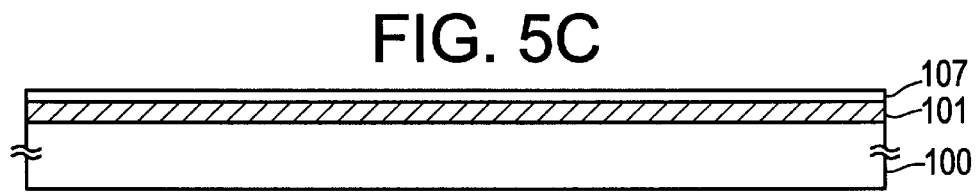

When the crystallizing step is over, a heat treatment is applied to the crystalline silicon film 106 at 600° C. for 1 to 4 hours to crystallize an amorphous portion so that a crystalline silicon film 107 of enhanced crystallinity is formed. Subsequently, the crystalline silicon film 107 is irradiated with a KrF excimer laser light to have easily diffused Ni that is locally present in the film. The excimer laser is shaped by an optical system into linear laser light of 0.5 mm in width and 12 cm in length, and the linear laser light scans the substrate in relatively one direction so that the entire substrate is irradiated with the laser light. Alternatively, a laser light may be shaped into a rectangle of which sides have lengths ranging from 5 to 10 cm (FIG. 5C).

Figure 5D:
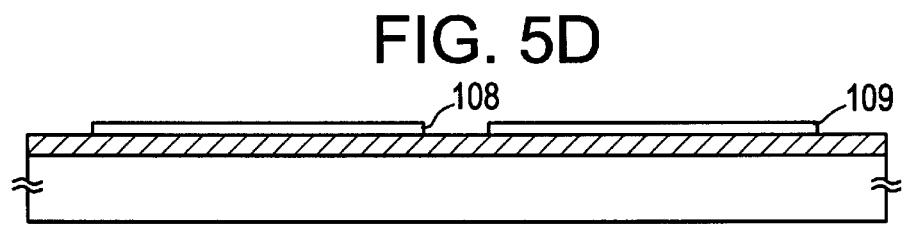

The crystalline silicon film 107 is then patterned into an island-like shape to form semiconductor layers 108 and 109. Incidentally, the irradiation with excimer laser mentioned above may follows the formation of the semiconductor layers 108 and 109 (FIG. 5D).

Figure 5E:
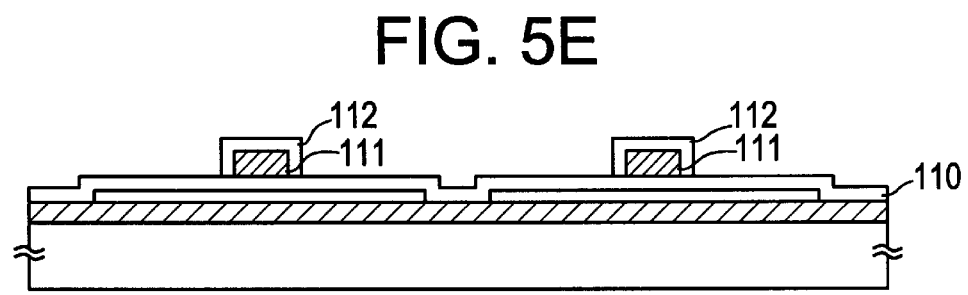

Next, a silicon oxynitride film 110 is formed by 120 nm in thickness through a plasma CVD method using $SiH_4$ and $N_2O$ as material gas. In a sputtering system, a tantalum film (Ta film) with a thickness of 40 nm is then formed and patterned on the silicon oxynitride film 110. The patterned Ta film is subjected to anodic oxidation to form an anodic oxide film 112 made of tantalum oxide. A part of the Ta film which is remained without being anodically oxidized functions as the gate wiring 111. Incidentally, the irradiation with an excimer laser light mentioned above may be performed before the film formation of the Ta film. In this example, it is sufficient if a laser light is irradiated to at least a region to be the channel formation region (FIG. 5E).

Figure 5F:
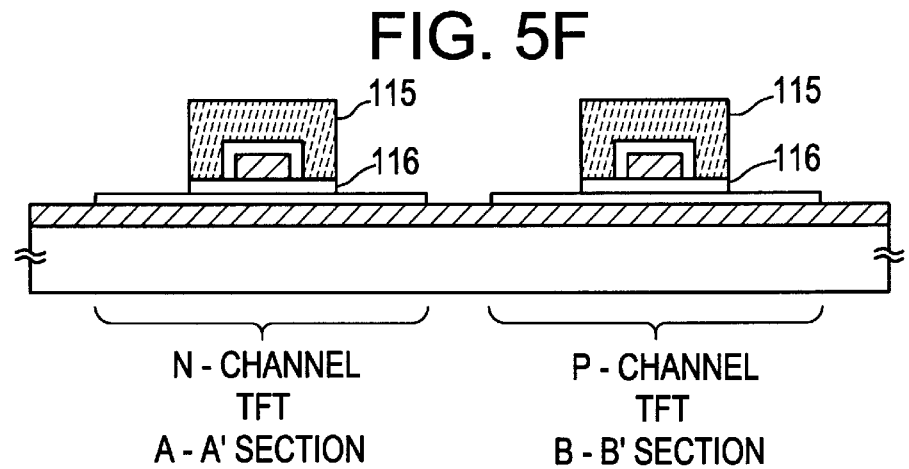

A resist mask 115 is next formed and the silicon oxynitride film 110 is patterned to form a gate insulating film 116. The gate insulating film 116 outwardly extends further than the anodic oxide film 111, and that portion outwardly extended past the film 111 defines a lightly doped region (FIG. 5F).

After the resist mask 115 is peeled off, a group XV element is then added in the semiconductor layers 108 and 109 to form source/drain regions of an N channel type TFT. P is added using as the doping gas phosphinc diluted with hydrogen to have a concentration of 5%. Doping at high acceleration rate with a small dose is first conducted so that phosphorus is added in the semiconductor layers through the gate insulating film 116, which is followed by the other doping at low acceleration rate with an large dose while the gate insulating film 116 functioning as a mask. According to conditions of the first doping, the acceleration voltage is 80 kV and the set dose is $6\times10^{13}$ atoms/cm$^3$, and according to conditions of the second doping, the acceleration voltage is 10 kV and the set dose is $5\times10^{14}$ atoms/cm$^3$.

Figure 6A:
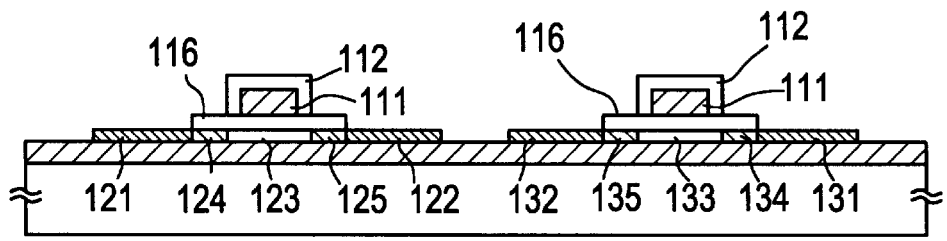
FIGS. 6A to 6D are sectional views showing the manufacturing process of TFTs.

Through the two adding steps of N type impurities, N+ regions 121, 122, 131 and 132, and N− regions 124, 125, 134 and 135 are formed in the semiconductor layers 108 and 109. Here, the N+ regions 121 and 122 of the semiconductor layer 108 are to be source/drain regions; the N− regions 124 and 125, lightly doped regions; and a region 123, a channel formation region (FIG. 6A).

When a heat treatment is applied in this state, nickel in regions 123 and 133 to which phosphorus is not added may be absorbed by the N+ regions 121, 122, 131 and 132. However, in this example, the removing step of the catalytic element is conducted after adding B (boron) that belongs to XIII element in the semiconductor layer 109 of the P channel type TFT.

Figure 6B:
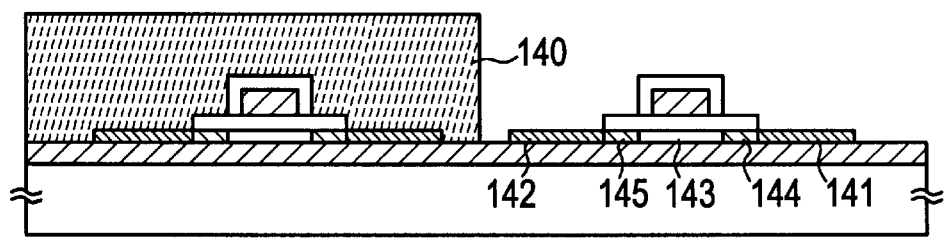

The N channel type TFT is therefore covered with a resist mask 140 and, after that, B is added in the semiconductor layer 109. Using as the doping gas diborane diluted with hydrogen to have a concentration of 5%, P+ source/drain regions 141 and 142, P− lightly doped regions 144 and 145 and a channel formation region 143 are formed in a self-alignment manner. By controlling the acceleration rate and the dose, as in the N channel type TFT, the layer 109 is formed into the P+ region and the P− region which are distinguished from each other (FIG. 6B).

In order to have the catalytic element absorbed in the source/drain regions 144 and 145 of P channel type, the concentration of boron ion is set to a value 1.3 to 2 times high the concentration of phosphorus ion added in those regions.

Figure 6C:
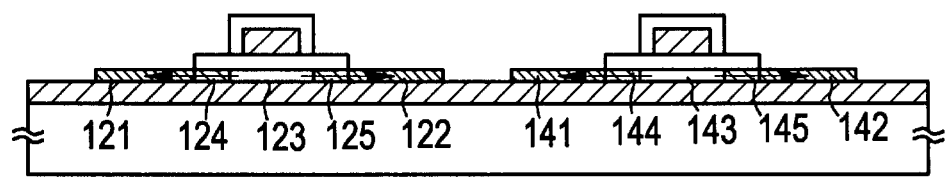

After forming the source/drain regions, a heat treatment is applied in an electric furnace at 500° C. for 2 hours. With this heat treatment, Ni that is intentionally added for crystallization of the amorphous silicon film is, as schematically indicated by arrows in FIG. 6C, diffused from the channel formation regions 123 and 143 to their respective source/drain regions 211 and 212, and 271 and 272. As a result, Ni in the channel formation regions 123 and 143, and in the lightly doped regions 124, 125, 144 and 145 is reduced and, on the other hand, the Ni concentration in the source/drain regions 121, 122, 141 and 142 which are used as a gettering sink becomes higher than in the channel formation regions 123 and 143 (FIG. 6C).

Further, this heat treatment activates, at the same time as gettering, phosphorus and boron which are added in the source/drain regions 211, 212, 271 and 272, and in the lightly doped regions 214, 215, 274 and 275.

Figure 6D:
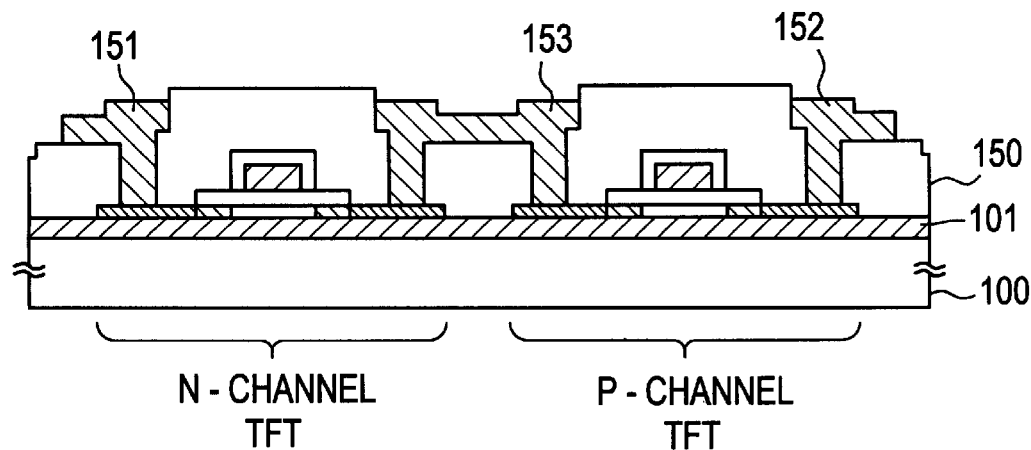

An interlayer insulating film 150 made of a silicon oxide film is then formed. After forming contact holes in the interlayer insulating film 150, a laminated film of titanium/ aluminum/titanium is formed as a material for an electrode and is patterned to form wirings 151 to 153. The wiring 153 here connects the N channel type TFT with the P channel type TFT to form a CMOS circuit. Further, an extraction wiring of a not-shown gate wiring 111 is also formed. Finally, a hydrogenation treatment is applied in hydrogen atmosphere at 350° C. for about 2 hours to execute a hydrogen-termination treatment for the whole TFT (FIG. 6D).

Example 2

Description will be made of this example with reference to FIGS. 7A to 8D. This example is an example in which a CMOS circuit is formed of an inverted staggered structure TFT.

First, a substrate 200 made of Corning 1737 glass is prepared. An base film 201 made of a silicon oxide film with a thickness of 120 nm is formed on the surface of the substrate 200. Next follows is film formation of a conductive film for forming a gate wiring 202. The conductive film here is formed of a three-layer film of tantalum nitride ($TaN_x$)/ Ta/$TaN_x$ by a sputtering method. The thickness of each $TaN_x$ film is set to 50 nm, and the thickness of the Ta film is set to 250 nm. This three-layer film is then patterned to form the gate wiring 202. Though appeared to be separated in the drawing, the gate wiring 202 in one CMOS circuit is a single unit (See FIG. 4).

A gate insulating film 203 is next formed to cover the gate wiring. The insulating film here is formed of a film comprising a silicon nitride film of 20 nm in thickness/ a silicon nitride oxide film of 100 nm in thickness. The gate wiring made of a Ta material is liable to occlude oxygen and hydrogen, and is coated with a dense silicon nitride film formed on the lower layer thereof to prevent this occlusion.

Figure 7A:
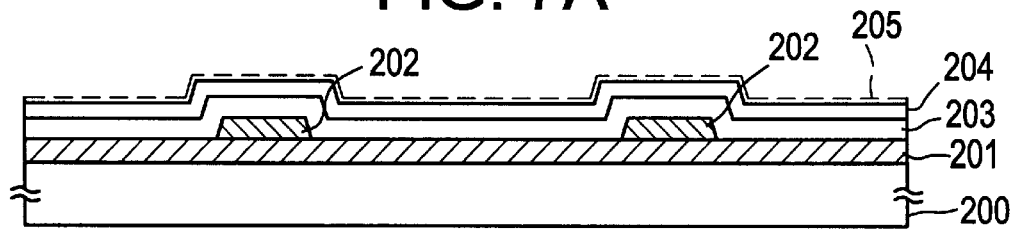
FIGS. 7A to 7E are sectional views showing a manufacturing process of TFTs according to Example 2.

Subsequently, an amorphous silicon film 204 with a thickness of 55 nm is formed on the gate insulating film 203 by a reduced pressure CVD method. The film is then coated by means of a spinner with a nickel acetate solution containing nickel by 10 ppm in terms of weight, and is dried to form a nickel film 205 (FIG. 7A).

Figure 7B:
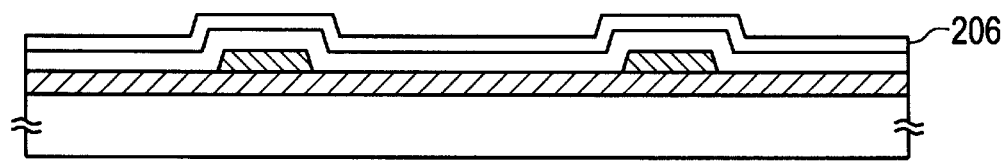

After a dehydrogenation step in a heating furnace at 500° C. for 1 hour, a heat treatment is next conducted in the heating furnace under nitrogen atmosphere at 550° C. for 4 hours to form a crystalline silicon film 206. Thereafter, as in Example 1, the substrate is thermally processed in the heating furnace at 600° C. to crystallize remained amorphous components and to reduce defects in grains, thereby forming a crystalline silicon film 206 of enhanced crystallinity. The crystalline silicon film 206 is then irradiated with an excimer laser light so as to be changed into a state in which Ni in the film 206 is easily diffused (FIG. 7B).

Figure 7C:
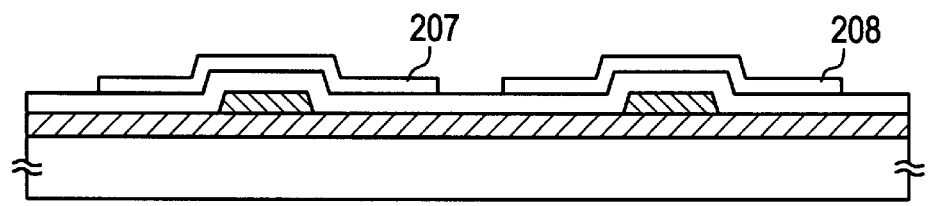

The crystalline silicon film 206 is patterned to form semiconductor layers 207 and 208 for N channel type TFT and P channel type TFT. An excimer laser light may be irradiated under this state (FIG. 7C).

Figure 7D:
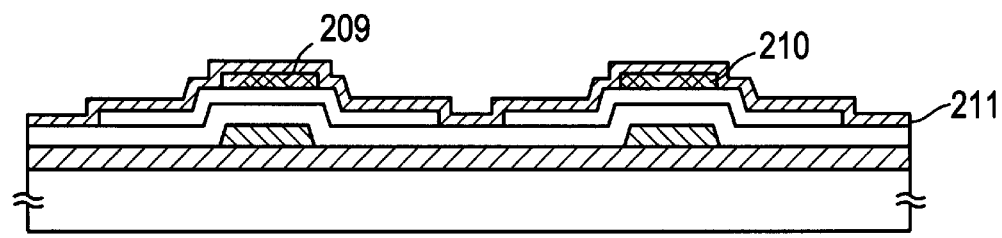
Figure 7E:
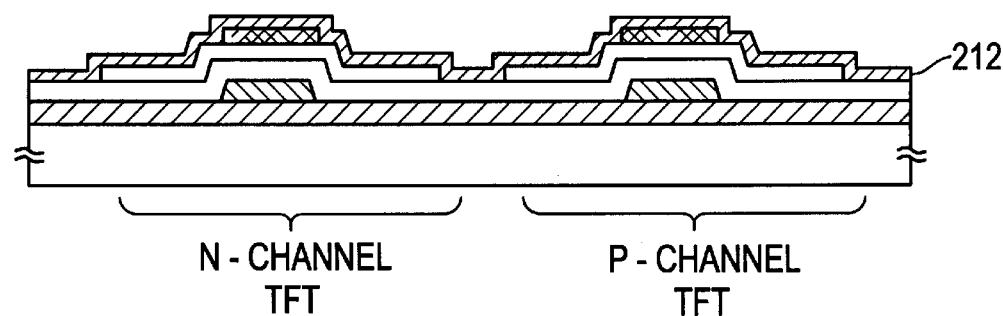

Channel stoppers 209 and 210 made of silicon oxide films are next formed so as to come in contact with the semiconductor layers 207 and 208. Through a plasma CVD method, a microcrystalline silicon film 211 is formed on the entire surface of the substrate 200 using monosilane and hydrogen as material gas. This microcrystalline silicon film 211 is formed without adding dopants such as phosphorus and boron (FIG. 7D).

Then, P which belongs the group XV element is added in the microcrystalline silicon film 211 through a plasma doping method to form an N type microcrystalline silicon film 212 added with P. Doping condition is that the P concentration is ten times the remained Ni concentration in the semiconductor layers 207 and 208, which is $1 \times 10^{19}$ to $1 \times 10^{22}$ atoms/$cm^3$.

The microcrystalline silicon film 211 exhibiting N type conductivity may be enhanced in its conductivity and utilized as a film for absorbing the catalytic element by forming the microcrystalline silicon film 212 added with P.

Accordingly, though a heat treatment at this state may have absorbed the catalytic element in the semiconductor layers 207 and 208, a removing step of the catalytic element is conducted after forming an N layer of the P channel type TFT, in this example.

Figure 8A:
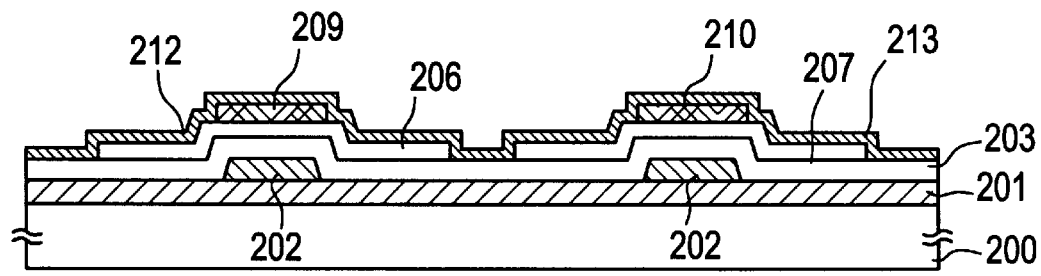
FIGS. 8A to 8D are sectional views showing the manufacturing process of TFTs.
Figure 8B:
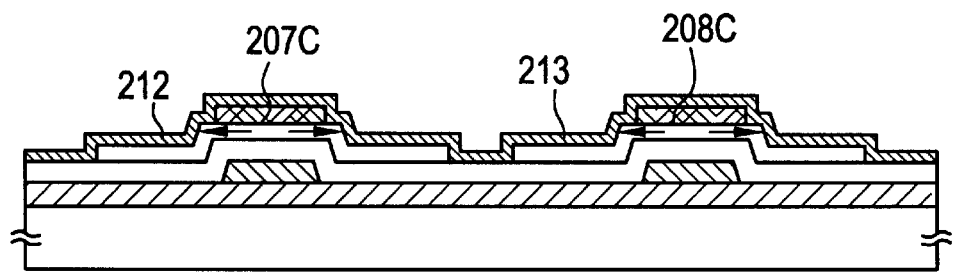
Figure 8C:
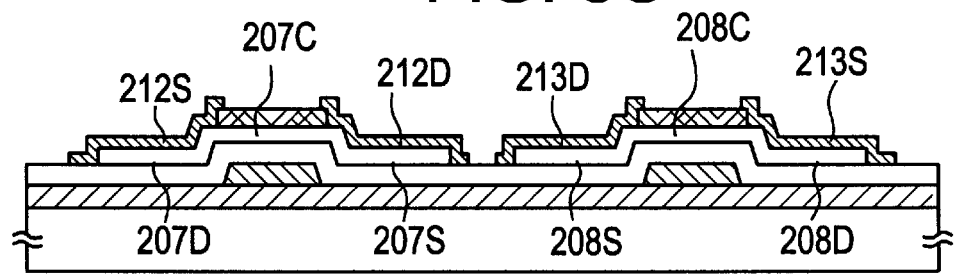

A resist mask is therefore formed to cover the N channel type TFT, and B that is a group XIII element is added to form a P type microcrystalline silicon film 213. The concentration of boron in the microcrystalline silicon film 213 is 1.3 to 2 times the concentration of phosphorus (FIG. 8A).

Next, the substrate is thermally processed in a heating furnace under nitrogen atmosphere at 550° C. for 4 hours. Ni in the semiconductor layers 207 and 208 is absorbed in the N type microcrystalline silicon film 212 and the P type microcrystalline silicon film 213. Regions 207c and 208c where a depletion layer is induced are not in direct contact with the microcrystalline silicon films 212 and 213. However, since Ni diffusion travels a length of about several μm, it is possible to diffuse in the silicon film 212 the catalytic element concentration in the regions 207c and 208c. This heat treatment activates P and B which arc added in the microcrystalline silicon films 212 and 213.

The microcrystalline silicon films 212 and 213 are then separated from each other by dry etching with $CF_4$ gas, and N type microcrystalline silicon films 212S and 212D are formed so as to come in contact with source/drain regions 207S and 207D of the semiconductor layer 207 to form an NI junction. Simultaneously, P type microcrystalline silicon films 213S and 213D are formed so as to come in contact with source/drain regions 208S and 208D of the semiconductor layer 208 to form a PI junction.

Figure 8D:
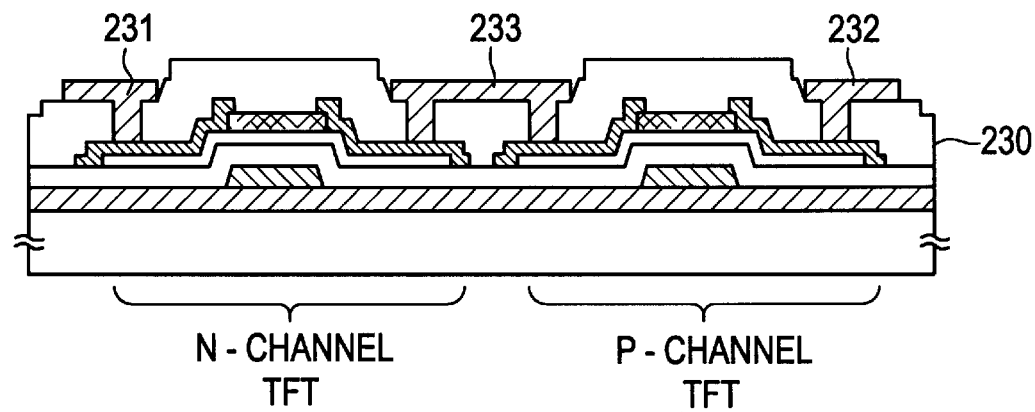

An interlayer insulating film 230 made of a silicon oxide film is next formed. After forming contact holes in the interlayer insulating film 230, a laminated film of titanium/ aluminum/titanium is formed as a material for an electrode and is patterned to form wirings 231 to 233. The wiring 233 here connects the N channel type TFT with the P channel type TFT to form a CMOS circuit. Further, an extraction wiring of a not-shown gate wiring 111 is also formed. Finally, a hydrogenation treatment is applied in hydrogen atmosphere at 350° C. for about 2 hours to execute a hydrogen-termination treatment for the whole TFT (FIG. 8D).

Example 3

In this example, the TFT described in Example 1 is applied to an active matrix substrate. The active matrix substrate of this example is used in a flat-plate type electro-optical device such as a liquid crystal display device and an EL display device.

Figure 9:
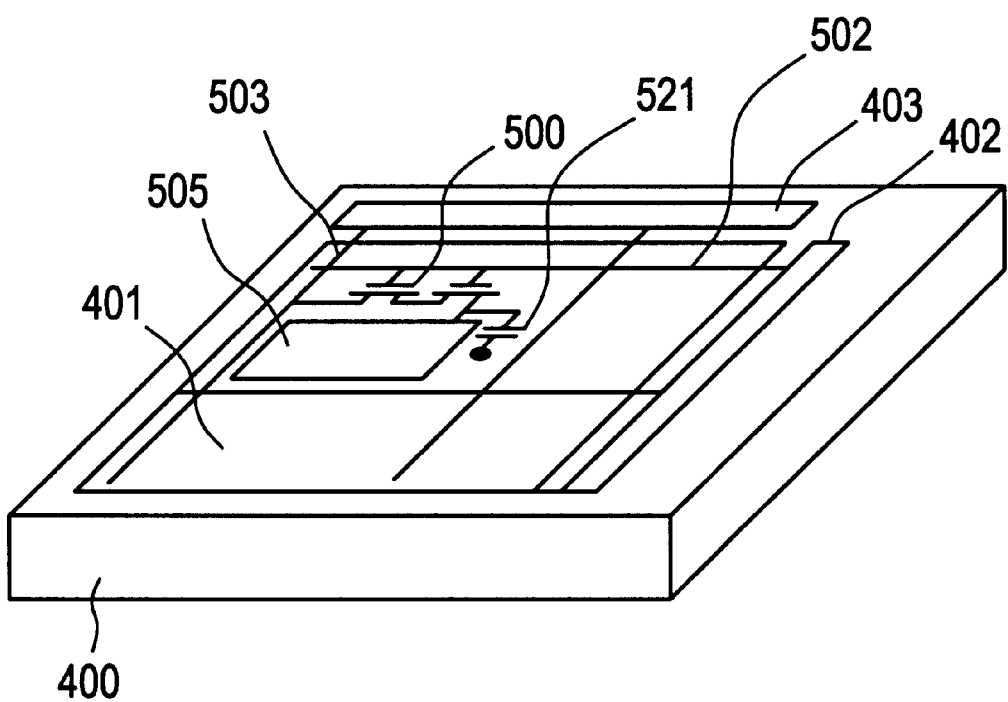
FIG. 9 is a perspective view of an active matrix substrate of Example 3.

This example will be described with reference to FIGS. 9 to 11. In FIGS. 9 to 11, the same reference numerals denote the same structural components. FIG. 9 is a schematic perspective view showing the active matrix substrate of this example. The active matrix substrate consists of a pixel matrix circuit 401, a scanning line driver circuit 402 and a signal line driver circuit 403 which are formed on a glass substrate 400. The scanning line driver circuit 402 and the signal line driver circuit 403 are connected with the pixel matrix circuit 401 respectively via scanning lines 502 and signal lines 503, and those driver circuits 402 and 403 are consisted mainly of CMOS circuits.

One scanning line 502 is formed for every row of the pixel matrix circuit 401 and one signal line 503 is formed for every column thereof. In the vicinity of each of the intersections of the scanning lines 502 and the signal lines 503, a pixel TFT 500 connected with respective wirings 502 and 503 is formed. The pixel TFT 500 is connected with a pixel electrode 505 and an additional capacitance 521.

Following the manufacturing steps of TFT in Example 1, N channel type TFTs and P channel type TFTs for the driver circuits 402 and 403, and the pixel TFT 500 for the pixel matrix circuit 401 are completed.

Figure 10A:
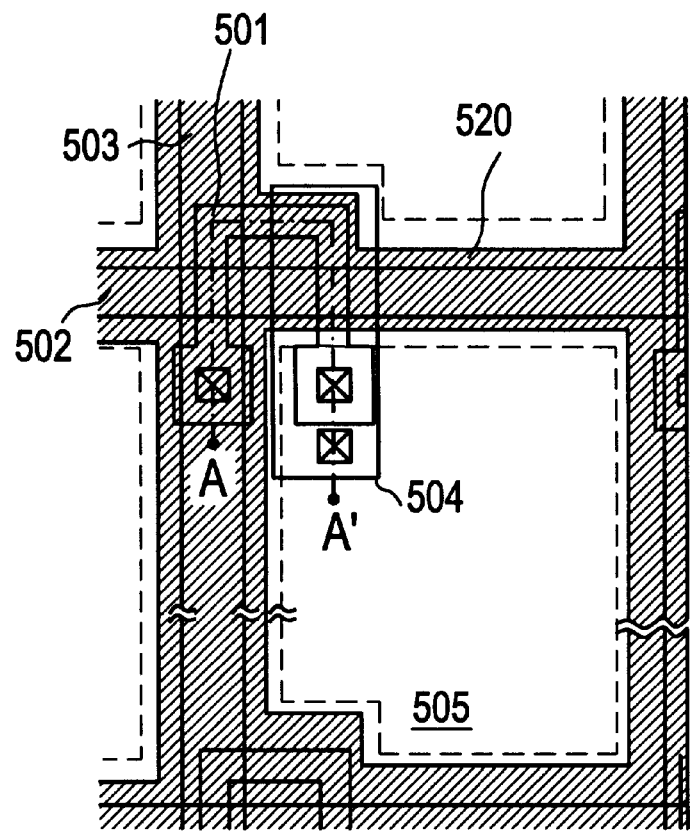
FIGS. 10A and 10B are top views showing a pixel matrix circuit and a CMOS circuit, respectively.
Figure 10B:
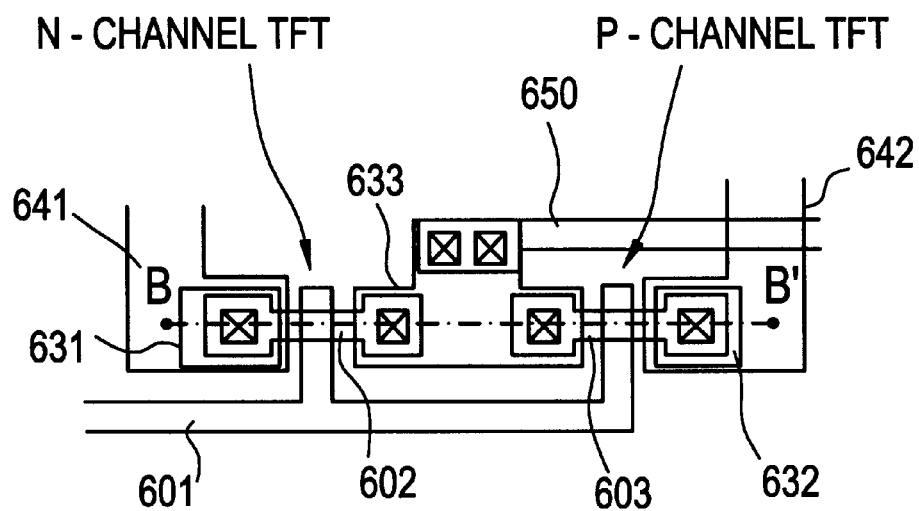
Figure 11:
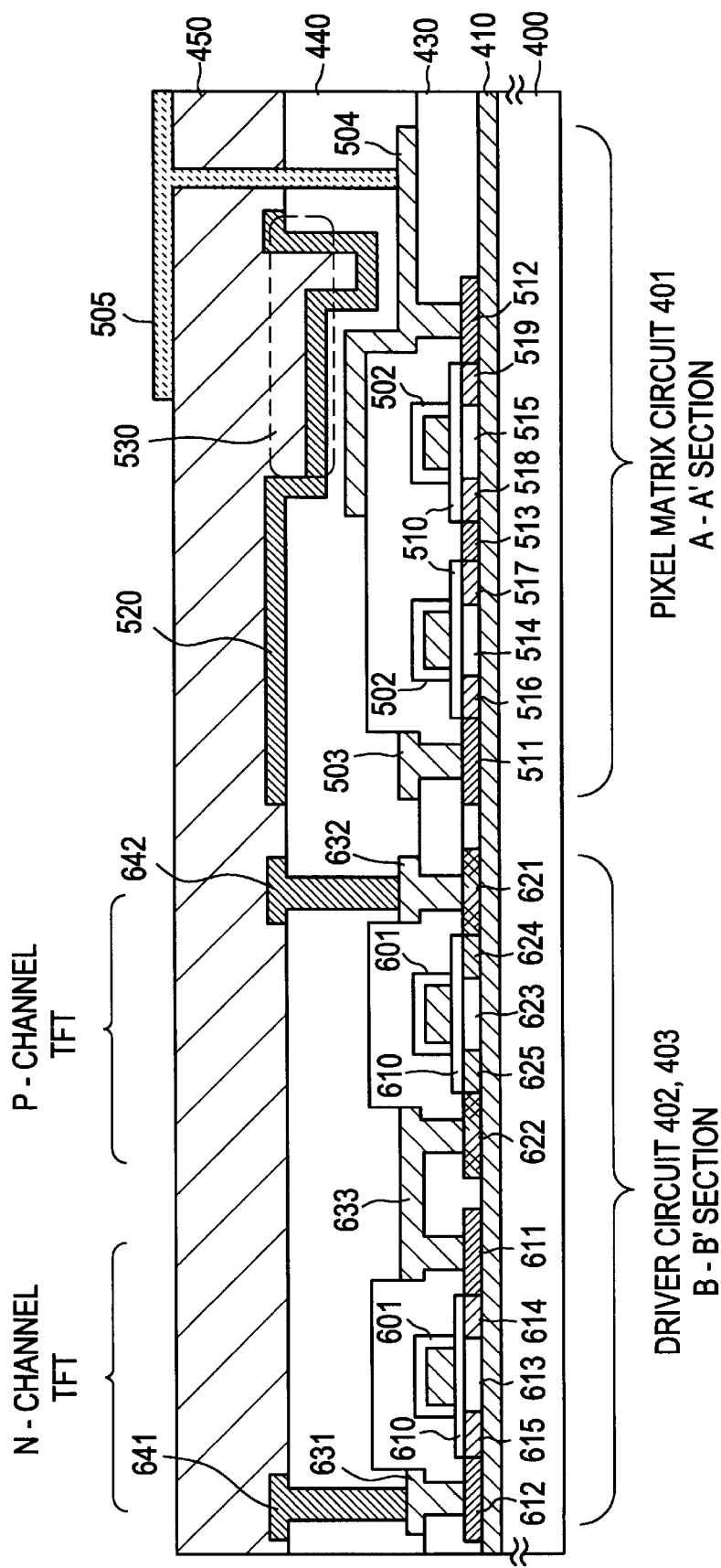
FIG. 11 is a sectional view of an active matrix substrate.

FIG. 10A is a top view of the pixel matrix circuit 401, showing the top of approximately one pixel. FIG. 10B is a top view of the CMOS circuit that constitutes the driver circuits 402 and 403. FIG. 11 is a sectional view of the active matrix substrate, and shows in section the pixel matrix circuit 401 and the CMOS circuit. The sectional view of the pixel matrix circuit 401 is a view cut along the chain line A—A' in FIG. 10A, and the sectional view of the CMOS circuit is a view cut along the chain line B—B' in FIG. 10B.

The pixel TFT 500 of the pixel matrix circuit 401 is the N channel type TFT. The circuit has a semiconductor layer 501 bent to have the shape of letter U (horseshoe shape). The scanning lines 502 that forms the first layer of wiring intersect the semiconductor layer 501 through a gate insulating film 510 therebetween.

In the semiconductor layer 501, N+ regions 511 to 513, two channel formation regions 514 and 515 and lightly doped regions (N− regions) 516 to 519 are formed. The N+ regions 511 and 512 are source/drain regions.

On the other hand, in the CMOS circuit, one gate wiring 601 intersects the two semiconductor layers 602 and 603 through a gate insulating film 610 therebetween. Formed in the semiconductor layer 602 are source/drain regions (N+ regions) 611 and 612, a channel formation region 613 and lightly doped regions (N− regions) 614 and 615. In the semiconductor layer 603, source/drain regions (P+ regions) 621 and 622, a channel formation region 623 and lightly doped regions (P− regions) 624 and 625 are formed.

After forming the source/drain regions on the semiconductor layers 501, 602 and 603, an interlayer insulating film 430 is formed over the entire substrate. On the interlayer insulating film 430, the signal lines 503, a drain electrode 504, source electrodes 631 and 632 and another drain electrode 633 are formed as the second layer of wiring-electrode.

As shown in FIG. 10A, the scanning lines 502 and the signal lines 503 are at right angles to each other through the interlayer insulating film 430 therebetween. The drain electrode 504 serves as an extracting electrode for connecting a drain region 512 with a pixel electrode 505, and also as a lower electrode of the additional capacitance 521. To enlarge the capacitance of the additional capacitance 521, the drain electrode 504 is formed as widely as possible unless an aperture is lowered.

As shown in FIG. 10B, the drain electrode 633 of the CMOS circuit is connected to a gate wiring 650 (the first layer of wiring) of other TFT.

A first flattening film 440 is formed on the second layer of wiring-electrode. In this example, a laminated film of silicon nitride (50 nm)/ silicon oxide (25 nm)/ acryl (1 μm) is utilized as the first flattening film 440. An organic resin film such as acryl, polyimide, benzocyclobutene (BCB) film, which is a solution-coat type insulating film capable of being formed through a spin coating method, may be formed to have a thickness of about 1 μm with high throughput and may give a good flat surface. Further, an organic resin film has lower permittivity as compared with a silicon nitride or silicon oxide film, so that the parasitic capacitance may be reduced.

Next formed as the third layer of wiring on the first flattening film 440 are a source wiring 641 made of a light-shielding conductive film such as titanium or chromic, a drain electrode 642, a drain wiring 643 and a black mask 520. As shown in FIG. 10A, the black mask 520 is a single unit in the pixel matrix circuit 401 and overlaps with the periphery of the pixel electrode 505 so as to cover all of the portions that do not contribute to display. The black mask covers the portions as shown by the dotted line in FIG. 10A. The electric potential of the black mask 520 is fixed to a predetermined value.

Prior to formation of these third layer of wirings 641, 642 and 520, the first flattening film 440 is etched to form on the drain electrode 504 a concave portion 530 at which only the silicon nitride film of the lowermost layer is remained.

At the concave portion 530, the drain electrode 504 and the black mask 520 are opposed to each other sandwiching only a silicon nitride film. The additional capacitance 521 is thus formed at the concave portion 530, the capacitance comprising as electrodes the drain electrode 504 and the black mask 520, and the silicon nitride film as the dielectric material. The silicon nitride film has high relative permittivity and may secure a larger capacitance by thinning the film thickness thereof.

A second flattening film 450 is formed on the third layer of wirings 641, 642 and 520. The second flattening film 450 is formed of an acrylic film having a thickness of 1.5 μm. Though the portion where the additional capacitance 521 is formed makes a large level difference, the film 450 may sufficiently flatten even a level difference that large.

Contact holes are formed in the first flattening film 440 and the second flattening film 450, and the pixel electrode 505 made of a transparent conductive film of such as ITO, InZnOx, ZnOx, or tin oxide is formed. The active matrix substrate is thus completed.

When the active matrix substrate of this example is applied to a liquid crystal display device, a not-shown orientated layer is formed so as to cover the entire substrate. The orientated layer undergoes a rubbing process if necessary.

An active matrix substrate for a reflection type AMLCD may also be manufactured if a conductive film of high reflectance, typically aluminum or a material containing aluminum as its main ingredient, is used for the pixel electrode 505.

The pixel TFT 500 in this example has the double gate structure, but may have the single gate structure or the multigate structure such as the triple gate structure. Alternatively, they may be formed of the inverted staggered structure TFT shown in Example 1. The structure of the active matrix substrate in this example is not limited to the structure of this example. The feature of the present invention resides in the construction of gate wirings, and hence the construction other than this may be decided on discretion of a person who carries out the invention.

Example 4

In this example, description will be made of a case where an active matrix type liquid crystal display device (referred to as AMLCD) is constructed as an example of an electro-optical device that uses the active matrix substrate shown in Example 3.

Figure 12A:
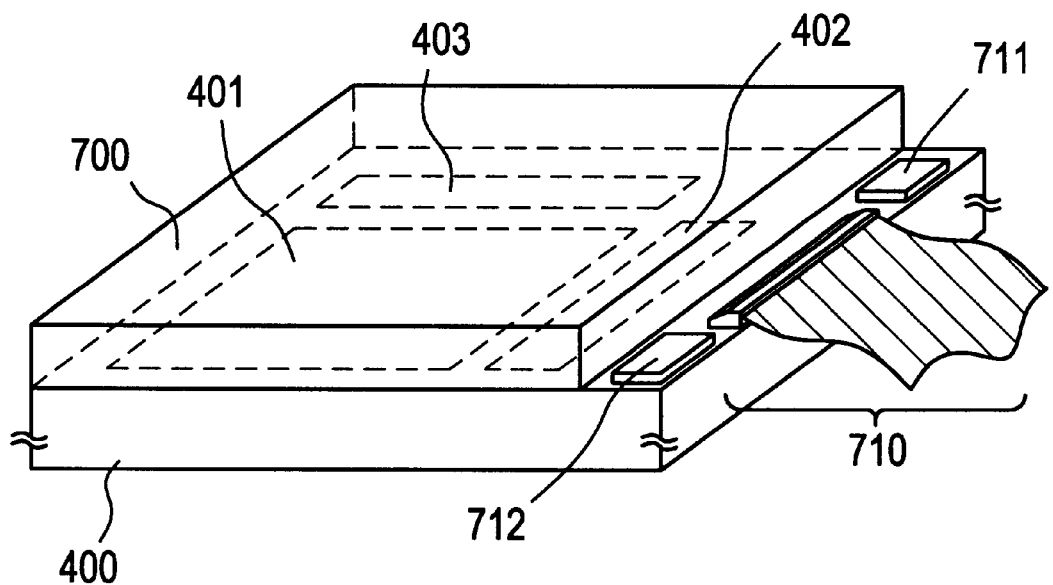
FIGS. 12A and 12B are perspective views each showing appearance of a liquid crystal display device of Example 4.
Figure 12B:
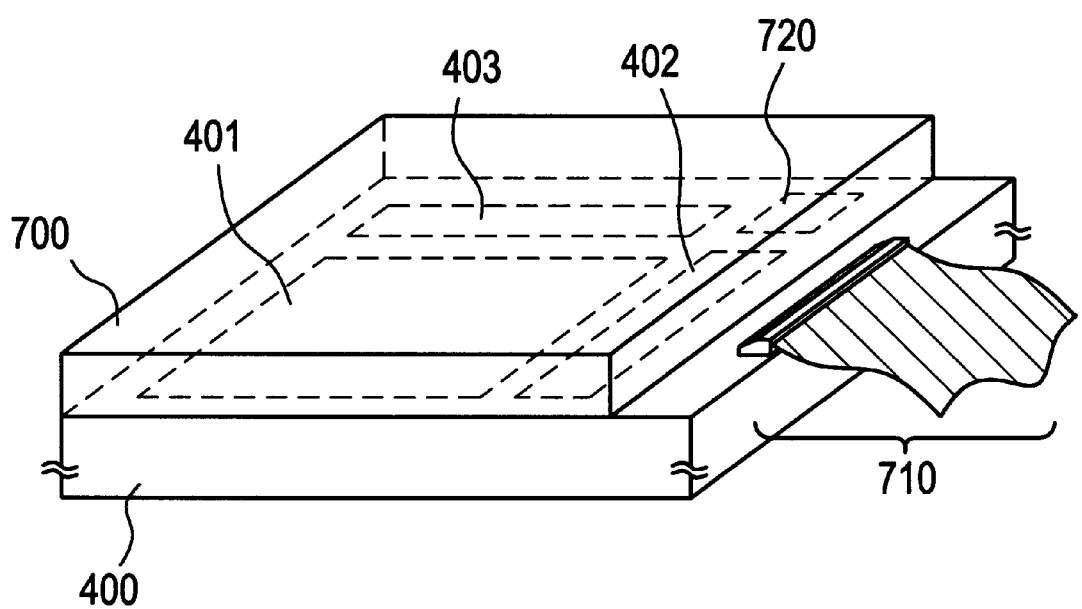

The outward appearance of an AMLCD of this example is shown in FIGS. 12A and 12B. In FIG. 12A, reference numerals that are the same as in FIG. 9 denote the same structural components therein. The active matrix substrate has a pixel matrix circuit 401, a scanning line driver circuit 402 and a signal line driver circuit 403 which are formed on a glass substrate 400.

The active matrix substrate is bonded with an opposite substrate 700. Liquid crystal is sealed in the gap between these two substrates. However, the opposite substrate 700 does not face a part of the active matrix substrate, which has an external terminal formed in the manufacturing process of the TFT. The external terminal is connected with an FPC (flexible printed circuit) 710 through which external signals and the power source are transmitted to the circuits 401 to 403.

The opposite substrate 700 comprises a transparent conductive film such as an ITO film formed on the entire surface of a glass substrate. The transparent conductive film serves as an opposite electrode to a pixel electrode of the pixel matrix circuit 401, and a liquid crystal material is driven by the electric field formed between the pixel electrode and the opposite electrode. The opposite substrate 700 may further have an orientated layer and a color filter formed thereon, if required.

To the active matrix substrate of this example, IC chips 711 and 712 are attached utilizing the surface to which the FPC 710 is attached. These IC chips are constructed by forming on a silicon substrate circuits such as a processing circuit of video signals, a timing pulse generating circuit, a γ-correction circuit, a memory circuit and an arithmetic circuit. Two IC chips are attached in FIG. 12A, but one chip, or three or more chips may be attached.

It is possible to take an alternative construction shown in FIG. 12B. In FIG. 12B, structural components identical with the ones in FIG. 12A are denoted by the same reference numerals. Illustrated here is an example in which the signal processing processed by the IC chips in FIG. 12A is executed by a logic circuit 720 that is formed of a TFT on the same substrate. In this case, the logic circuit 720, as are the driver circuits 402 and 403, is constructed on the CMOS circuit-basis.

This example employs an arrangement (BM on TFT) in which a black mask is provided on the active matrix substrate, and the arrangement may be modified to have, in addition to the black mask mentioned, another black mask provided on the opposite substrate.

A color filter may be used to display in color, or the display device may have the construction dispensed with a color filter in which liquid crystal is driven in the ECB (field control birefringence) mode, GH (guest host) mode or the like. Also, the display device may take a construction using micro lens arrays as described in Japanese Patent Application Laid-open No. Sho 8-15686.

Example 5

The TFT shown in Examples 1 and 2 may be applied to various electro-optical devices other than AMLCD and to various semiconductor circuits.

As the electro-optical devices other than AMLCD, an EL (electroluminescense) display device, image sensor and the like may be enumerated.

As the semiconductor circuits, what may be enumerated are an arithmetic processing circuit such as a microprocessor consisted of IC chips, and a high-frequency module (such as MMIC) that handles input and output signals of a portable device.

In this way, the present invention may be applied to all the semiconductor devices that function with circuits consisted of insulated-gate type TFTs.

Example 6

A CMOS circuit and a pixel matrix circuit formed through carrying out the present invention may be applied to various electro-optical devices (active matrix type liquid crystal display devices, active matrix type EL display devices, active matrix type EC display devices). Namely, the present invention may be embodied in all the electronic equipments that incorporate those electro-optical devices as display media.

As such an electronic equipment, a video camera, a digital camera, a projector (rear-type projector or front-type projector), a head-mount display (goggle-type display), a navigation system for vehicle, a personal computer, and a portable information terminal (a mobile computer, a cellular phone, or an electronic book) may be enumerated. Examples of those are shown in FIGS. 13A to 14D.

Figure 13A:
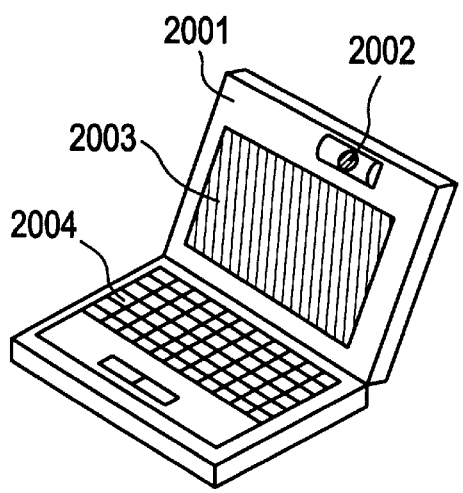
FIGS. 13A to 13F are structural views showing electronic equipments in Example 6.

FIG. 13A shows a personal computer comprising a main body 2001, an image inputting unit 2002, a display device 2003, and a key board 2004. The present invention is applicable to the image inputting unit 2002, the display device 2003, and other signal control circuits.

Figure 13B:
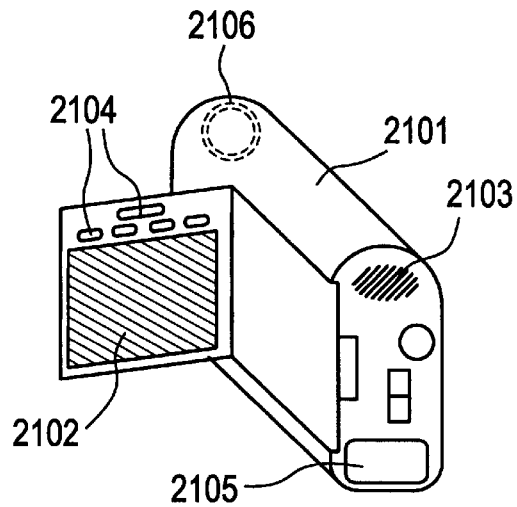

FIG. 13B shows a video camera comprising a main body 2101, a display device 2102, a voice input unit 2103, an operation switch 2104, a battery 2105, and an image receiving unit 2106. The present invention is applicable to the display device 2102, the voice input unit 2103, and other signal control circuits.

Figure 13C:
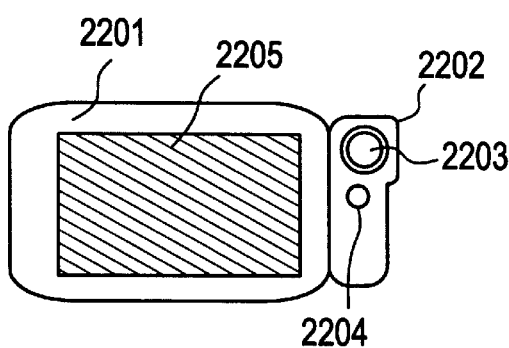

FIG. 13C shows a mobile computer comprising a main body 2201, a camera unit 2202, an image receiving unit 2203, an operation switch 2204, and a display device 2205. The present invention is applicable to the display device 2205 and other signal control circuits.

Figure 13D:
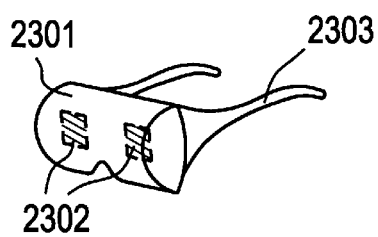

FIG. 13D shows a goggle-type display comprising a main body 2301, a display device 2302 and an arm portion 2303. The present invention is applicable to the display device 2302 and other signal control circuits.

Figure 13E:
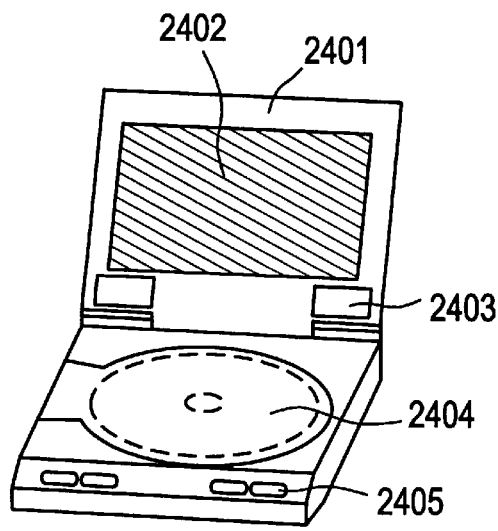

FIG. 13E shows a player that employs a recording medium in which programs are recorded (hereinafter referred to as recording medium), and comprises a main body 2401, a display device 2402, a speaker unit 2403, a recording medium 2404, and an operation switch 2405. Incidentally, this player uses as the recording medium a DVD (digital versatile disc), a CD and the like to serve as a tool for enjoying music or movies, for playing games and for connecting to the Internet. The present invention is applicable to the display device 2402 and other signal control circuits.

Figure 13F:
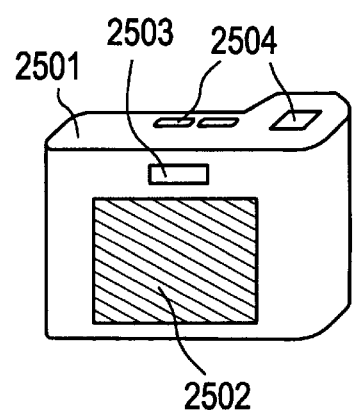

FIG. 13F shows a digital camera comprising a main body 2501, a display device 2502, an eye piece section 2503, an operation switch 2504, and an image receiving unit (not shown). The present invention is applicable to the display device 2502 and other signal control circuits.

Figure 14A:
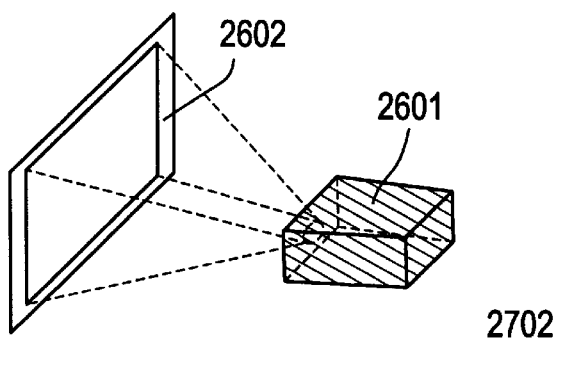
FIGS. 14A to 14D are structural views showing electronic equipments in Example 6.

FIG. 14A shows a front-type projector comprising a display device 2601 and a screen 2602. The present invention is applicable to the display device 2601 and other signal control circuits.

Figure 14B:
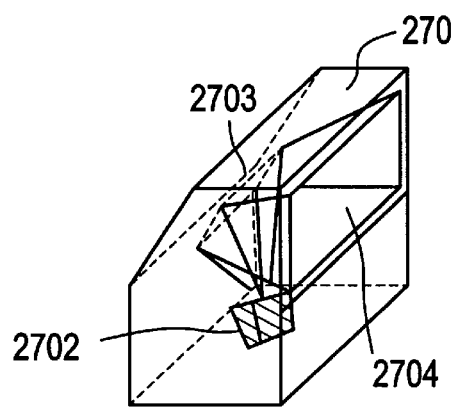

FIG. 14B shows a rear-type projector comprising a main body 2701, a display device 2702, a mirror 2703, and a screen 2704. The present invention is applicable to the display device 2702 and other signal control circuits.

Figure 14C:
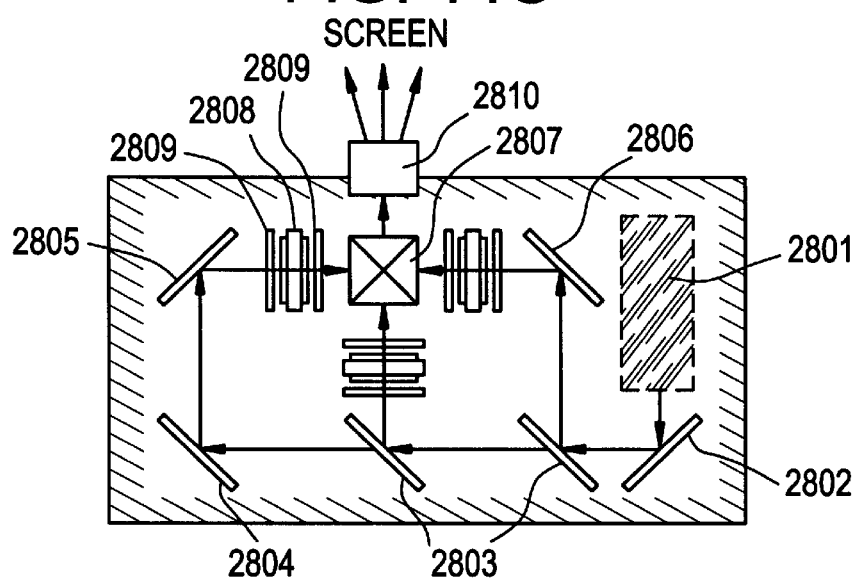

FIG. 14C is a diagram showing an example of the structure of the display devices 2601 and 2702 in FIGS. 14A and 14B. The display device 2601 or 2702 comprises a light source optical system 2801, mirrors 2802 and 2804 to 2806, dichroic mirrors 2803, a prism 2807, liquid crystal display devices 2808, phase difference plates 2809, and a projection optical system 2810. The projection optical system 2810 consists of an optical system provided with a projection lens. This example shows an example of "three plate type", but not particularly limited thereto. For instance, the invention may be applied also to "single plate type". Further, in the light path indicated by an arrow in FIG. 14C, an optical system such as an optical lens, a film having a polarization function, a film for adjusting a phase difference, an IR film may be provided on discretion of a person who carries out the invention.

Figure 14D:
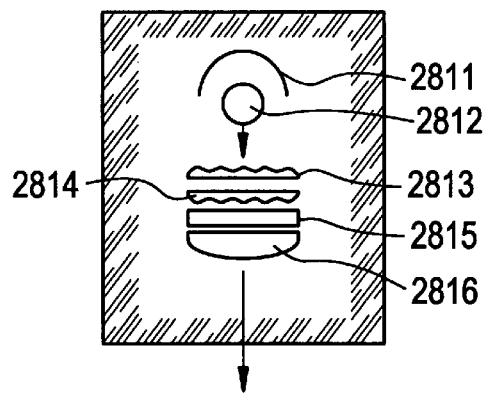

FIG. 14D is a diagram showing an example of the structure of the light source optical system 2801 in FIG. 14C. In this example, the light source optical system 2801 comprises a reflector 2811, light sources 2812, 2813 and 2814, a polarization conversion device 2815, and a condenser lens 2816. The light source optical system shown in FIG. 14D is an example thereof, and is not particularly limited. For instance, on discretion of a person who carries out the invention, the light source optical system may be provided with an optical system such as an optical lens, a film having a polarization function, a film for adjusting the phase difference, and an IR film.

As described above, the present invention has so wide application range that it is applicable to electronic equipments in any fields. In addition, the electronic equipment of this example may be realized with any construction obtained by combining Examples 1 to 5.

According to the present invention, when using a technique for crystallizing or for enhancing in crystallinity a semiconductor film with the use of catalytic elements, the film is irradiated with a laser light or an intense light to have the catalytic elements easily diffused prior to the removing step of the catalytic elements. The removing step of the catalytic elements is therefore efficiently performed. Also, the removing step of the catalytic elements may be conducted at a process temperature lower than 600° C., which makes it satisfyingly possible to use a glass substrate.

What is claimed is:

1. A method of manufacturing a semiconductor device comprising steps of:
   introducing catalytic elements into a semiconductor film of low crystallinity;
   applying first heat treatment to said semiconductor film of low crystallinity to form a crystalline semiconductor film including an amorphous portion;
   applying second heat treatment to said crystalline semiconductor film to enhance its crystallinity;
   irradiating said crystalline semiconductor film of enhanced crystallinity with a laser light or an intense light;
   selectively adding a group XV element to said crystalline semiconductor film after said irradiating; and
   applying third heat treatment to said crystalline semiconductor film of enhanced crystallinity to have said catalytic elements absorbed in said region added with group XV elements.

2. A method according to claim 1, wherein the first heat treatment is performed at a temperature from 450° C. to 650° C.

3. A method according to claim 1, wherein the second heat treatment is performed at a temperature higher than the first heat treatment.

4. A method according to claim 1, wherein the second heat treatment is performed at a temperature from 500° C. to 1,100° C.

5. A method according to claim 1, wherein the third heat treatment is performed at a temperature from 450° C. to 850° C.

6. A method according to claim 1, wherein said semiconductor film of low crystallinity is an amorphous silicon film formed by a reduced pressure CVD method.

7. A method according to claim 1, wherein said catalytic elements are one or plural kinds of elements selected from a group consisting of Ni, Fe, Co, Ru, Rh, Pd, Os, Ir, Pt, Cu, Au and Ge.

8. A method according to claim 1, wherein said semiconductor device is an active matrix type display device.

9. A method according to claim 1, wherein said semiconductor device is an EL display device.

10. A method according to claim 1, said semiconductor device is an electronic equipment selected from the group consisting of a video camera, a digital camera, a rear-type projector, a front-type projector, a head-mount display, a goggle-type display, a navigation system for vehicle, a personal computer, and a portable information terminal, a mobile computer, a cellular phone, and an electronic book.

11. A method according to claim 1, wherein said semiconductor device comprises a plurality of thin film transistors, and wherein regions of semiconductor film to which said group XV element is added include at least one of source and drain regions of said thin film transistors.

12. A method according to claim 1, wherein said group XV element is added to said semiconductor film by selectively disposing a film containing said group XV element in contact with portions of said semiconductor film.

13. A method according to claim 1, wherein said first heat treatment is performed for 4–12 hours.

14. A method according to claim 1, wherein said third heat treatment is performed for 24 hours.

15. A method of manufacturing a semiconductor device comprising steps of:
   introducing catalytic elements into a semiconductor film of low crystallinity;
   applying first heat treatment to said semiconductor film to form a crystalline semiconductor film;
   applying second heat treatment to said crystalline semiconductor film to enhance its crystallinity after said first heat treatment;
   irradiating said crystalline semiconductor film of enhanced crystallinity with a laser light or an intense light;
   adding a group XV element to said crystalline semiconductor film after said irradiating; and
   applying third heat treatment to said crystalline semiconductor film of enhanced crystallinity to have said catalytic elements absorbed in said region added with group XV elements.

16. A method according to claim 15, wherein said first heat treatment is performed for 4–12 hours.

17. A method according to claim 15, wherein said third heat treatment is performed for 24 hours.

18. A method according to claim 15, wherein said first heat treatment is performed to diffuse said catalytic element into said semiconductor film.

19. A method according to claim 15, wherein the first heat treatment is performed at a temperature from 450° C. to 650° C.

20. A method according to claim 15, wherein the second heat treatment is performed at a temperature higher than the first heat treatment.

21. A method according to claim 15, wherein the second heat treatment is performed at a temperature from 500° C. to 1,100° C.

22. A method according to claim 15, wherein the third heat treatment is performed at a temperature from 450° C. to 850° C.

23. A method according to claim 15, wherein said semiconductor film of low crystallinity is an amorphous silicon film formed by a reduced pressure CVD method.

24. A method according to claim 15, wherein said catalytic elements are one or plural kinds of elements selected from a group consisting of Ni, Fe, Co, Ru, Rh, Pd, Os, Ir, Pt, Cu, Au and Ge.

25. A method according to claim 15, wherein said semiconductor device is an active matrix type display device.

26. A method according to claim 15, wherein said semiconductor device is an EL display device.

27. A method according to claim 15, said semiconductor device is an electronic equipment selected from the group consisting of a video camera, a digital camera, a rear-type projector, a front-type projector, a head-mount display, a goggle-type display, a navigation system for vehicle, a personal computer, and a portable information terminal, a mobile computer, a cellular phone, and an electronic book.

28. A method according to claim 15, wherein said semiconductor device has a plurality of thin film transistors, and wherein regions of semiconductor film to which are added said group XV element are include at least one of source and drain regions of said thin film transistors.

29. A method according to claim 15, wherein said group XV element is add to said semiconductor film by selectively disposing a film containing said group XV element in contact with portions of said semiconductor film.

30. A method of manufacturing a semiconductor device comprising steps of:
    introducing catalytic elements into a semiconductor film of low crystallinity;
    applying first heat treatment to said semiconductor film to form a crystalline semiconductor film including an amorphous portion;
    applying second heat treatment to said crystalline semiconductor film to enhance its crystallinity;
    irradiating said crystalline semiconductor film of enhanced crystallinity with a laser light or an intense light;
    adding a group XV element to said crystalline semiconductor film after said irradiating; and
    applying third heat treatment to said crystalline semiconductor film of enhanced crystallinity to have said catalytic elements absorbed in said region added with group XV elements.

31. A method according to claim 30, wherein said first heat treatment is performed for 4–12 hours.

32. A method according to claim 30, wherein said third heat treatment is performed for 24 hours.

33. A method according to claim 30, wherein the first heat treatment is performed at a temperature from 450° C. to 650° C.

34. A method according to claim 30, wherein the second heat treatment is performed at a temperature higher than the first heat treatment.

35. A method according to claim 30, wherein the second heat treatment is performed at a temperature from 500° C. to 1,100° C.

36. A method according to claim 30, wherein the third heat treatment is performed at a temperature from 450° C. to 850° C.

37. A method according to claim 30, wherein said semiconductor film of low crystallinity is an amorphous silicon film formed by a reduced pressure CVD method.

38. A method according to claim 30, wherein said catalytic elements are one or plural kinds of elements selected from a group consisting of Ni, Fe, Co, Ru, Rh, Pd, Os, Ir, Pt, Cu, Au and Ge.

39. A method according to claim 30, wherein said semiconductor device is an active matrix type display device.

40. A method according to claim 30, wherein said semiconductor device is an EL display device.

41. A method according to claim 30, said semiconductor device is an electronic equipment selected from the group consisting of a video camera, a digital camera, a rear-type projector, a front-type projector, a head-mount display, a goggle-type display, a navigation system for vehicle, a personal computer, and a portable information terminal, a mobile computer, a cellular phone, and an electronic book.

42. A method according to claim 30, wherein said semiconductor device has a plurality of thin film transistors, and wherein regions of semiconductor film to which are added said group XV element are include at least one of source and drain regions of said thin film transistors.

43. A method according to claim 30, wherein said group XV element is add to said semiconductor film by selectively disposing a film containing said group XV element in contact with portions of said semiconductor film.

44. A method of manufacturing a semiconductor device comprising steps of:
    introducing catalytic elements into a semiconductor film of low crystallinity;
    applying first heat treatment to said semiconductor film to form a crystalline semiconductor film;
    applying second heat treatment to said crystalline semiconductor film to enhance its crystallinity;
    irradiating said crystalline semiconductor film of enhanced crystallinity with a laser light or an intense light;
    selectively adding a group XV element to said crystalline semiconductor film after said irradiating; and
    applying third heat treatment to said crystalline semiconductor film of enhanced crystallinity to have said catalytic elements absorbed in said region added with group XV elements.

45. A method according to claim 44, wherein said first heat treatment is performed for 4–12 hours.

46. A method according to claim 44, wherein said third heat treatment is performed for 24 hours.

47. A method according to claim 44, wherein said first heat treatment is performed to diffuse said catalytic element into said semiconductor film.

48. A method according to claim 44, wherein the first heat treatment is performed at a temperature from 450° C. to 650° C.

49. A method according to claim 44, wherein the second heat treatment is performed at a temperature higher than the first heat treatment.

50. A method according to claim 44, wherein the second heat treatment is performed at a temperature from 500° C. to 1,100° C.

51. A method according to claim 44, wherein the third heat treatment is performed at a temperature from 450° C. to 850° C.

52. A method according to claim 44, wherein said semiconductor film of low crystallinity is an amorphous silicon film formed by a reduced pressure CVD method.

53. A method according to claim 44, wherein said catalytic elements are one or plural kinds of elements selected from a group consisting of Ni, Fe, Co, Ru, Rh, Pd, Os, Ir, Pt, Cu, Au and Ge.

54. A method according to claim 44, wherein said semiconductor device is an active matrix type display device.

55. A method according to claim 44, wherein said semiconductor device is an EL display device.

56. A method according to claim 44, said semiconductor device is an electronic equipment selected from the group consisting of a video camera, a digital camera, a rear-type projector, a front-type projector, a head-mount display, a goggle-type display, a navigation system for vehicle, a personal computer, and a portable information terminal, a mobile computer, a cellular phone, and an electronic book.

57. A method according to claim 44, wherein said semiconductor device has a plurality of thin film transistors, and wherein regions of semiconductor film to which are added said group XV element are include at least one of source and drain regions of said thin film transistors.

58. A method according to claim 44, wherein said group XV element is add to said semiconductor film by selectively disposing a film containing said group XV element in contact with portions of said semiconductor film.

* * * * *